United States Patent
Hiraoka et al.

(10) Patent No.: US 8,022,011 B2
(45) Date of Patent: *Sep. 20, 2011

(54) PHOTOCATALYST ELEMENT, METHOD AND DEVICE FOR PREPARING THE SAME

(75) Inventors: Junji Hiraoka, Fukuoka (JP); Takahiro Doke, Fukuoka (JP); Hisato Haraga, Fukuoka (JP); Daisuke Noguchi, Kanagawa (JP); Yoshio Kawamata, Kanagawa (JP)

(73) Assignee: Shibaura Mechatronics Corporation, Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/769,343

(22) Filed: Apr. 28, 2010

(65) Prior Publication Data
US 2010/0210447 A1   Aug. 19, 2010

Related U.S. Application Data

(62) Division of application No. 10/490,116, filed as application No. PCT/JP02/10007 on Sep. 27, 2002, now Pat. No. 7,799,731.

(30) Foreign Application Priority Data

Sep. 28, 2001  (JP) ................. 2001-303953

(51) Int. Cl.
 C23C 14/08  (2006.01)
 C23C 14/34  (2006.01)
 B01J 21/06  (2006.01)
(52) U.S. Cl. ............... 502/350; 204/192.1; 204/192.12; 204/298.02; 423/608
(58) Field of Classification Search .............. 502/4, 350, 502/400; 423/608, 610; 204/192.1, 192.12
See application file for complete search history.

(56) References Cited

U.S. PATENT DOCUMENTS
6,194,346 B1   2/2001  Tada et al.
(Continued)

FOREIGN PATENT DOCUMENTS
EP     0 882 686 A1   12/1998
(Continued)

OTHER PUBLICATIONS

Atsuo Yasumori, Hiroyuki Shinoda, Yoshikazu Kameshima, Shigeo Hayashi and Kiyoshi Okada, "Photocatalytic and photoelectrochemical properties of TiO2-based multiple layer thin film prepared by sol-gel and reactive-sputtering methods," J. Mater. Chem. 11 (2001), pp. 1253-1257.*

(Continued)

Primary Examiner — Stanley Silverman
Assistant Examiner — Diana J Liao
(74) Attorney, Agent, or Firm — Oblon, Spivak, McClelland, Maier & Neustadt, L.L.P.

(57) ABSTRACT

A photocatalyst according to the invention comprises a photocatalytic film of a compound of titanium and oxygen and is characterized in that the photocatalytic film is made porous and has 0.02 or higher value as a value calculated by dividing the arithmetical mean deviation of profile Ra with the film thickness. The photocatalytic film can also be specified by the intensity ratio between x-ray diffraction peaks of the anatase structure of titanium oxide. Such a porous photocatalytic material can be obtained by a reactive sputtering method in conditions of adjusting film formation parameters such as the film formation rate, the sputtering pressure, the substrate temperature, the oxygen partial pressure and the like in proper ranges, respectively, and the photocatalyst material is provided with excellent decomposition and hydrophilization capability.

12 Claims, 36 Drawing Sheets

U.S. PATENT DOCUMENTS

| | | |
|---|---|---|
| 6,228,502 B1 | 5/2001 | Saitoh et al. |
| 6,379,776 B1 | 4/2002 | Tada et al. |
| 7,462,578 B2 | 12/2008 | Hiraoka et al. |
| 7,608,562 B2 | 10/2009 | Hiraoka et al. |
| 2004/0248725 A1 | 12/2004 | Hiraoka et al. |

FOREIGN PATENT DOCUMENTS

| | | |
|---|---|---|
| EP | 0 887 179 A1 | 12/1998 |
| EP | 901 991 | 3/1999 |
| EP | 1 074 525 A1 | 2/2001 |
| JP | 8-302856 | 11/1996 |
| JP | 10-231146 | 9/1998 |
| JP | 11-29861 | 2/1999 |
| JP | 11-90237 | 4/1999 |
| JP | 2000-239047 | 9/2000 |
| JP | 2001-46882 | 2/2001 |
| JP | 2001-51107 | 2/2001 |
| JP | 2001-98187 | 4/2001 |
| JP | 2001-129474 | 5/2001 |
| JP | 2001-149790 | 6/2001 |
| JP | 2001-262335 | 9/2001 |
| JP | 2001-335343 | 12/2001 |
| JP | 2002-256416 | 9/2002 |
| JP | 2004-510051 | 4/2004 |
| WO | WO 98/27021 | 6/1998 |
| WO | WO 02/24971 A1 | 3/2002 |

OTHER PUBLICATIONS

Yuko Tachibana, Hisashi Ohsaki, Atsushi Hayashi, Akira Mitsui and Yasuo Hayashi, "TiO2-X sputter for high rate deposition of TiO2," Vacuum vol. 59, Issues 2-3 (Nov. 2000), pp. 836-843.*

Huiyao Wang, et al., "Effects of substrate temperature on the microstructure and photocatalytic reactivity of TiO2 films". Journal of Materials Science: Materials in Electronics, vol. 9, No. 5, pp. 327-330 1998.

S.K. Zheng, et al., "Photocatalytic activity of nanostnictured T1O2 thin films prepared by dc magnetron sputtering method", Vacuum, vol. 62, No. 4, pp. 361-366 Jun. 22, 2001.

Susumu Suzuki, et al., "1. sputtering-hou niyoru kikarishokubai TiO2 no seimaku", Asahi Glass Co. Ltd. Kenkyu Hokoku, vol. 49, pp. 1-6 2000.

M. H. Suhail, et al., "dc reactive magnetron sputtering of titanium-structural and optical characterization of $TiO_2$ films", Journal of Applied Physics, American Institute of Physics, XP001016416, vol. 71, No. 3, Feb. 1, 1992, pp. 1421-1427.

Li-jian Meng, et al., "The effect of substrate temperature on the properties of d.c. reactive magnetron sputtered titanium oxide films", Thin Solid Films, XP000360767, vol. 223, No. 2, Feb. 15, 1993, pp. 242-247.

B. R. Weinberger, et al., "Titanium dioxide photocatalysts produced by reactive magnetron suputtering", Applied Physics Letters, American Institute of Physics, XP000507607, vol. 66, No. 18, May 1, 1995, pp. 2409-2411.

U.S. Appl. No. 12/769,390, filed Apr. 28, 2010, Hiraoka, et al.

* cited by examiner

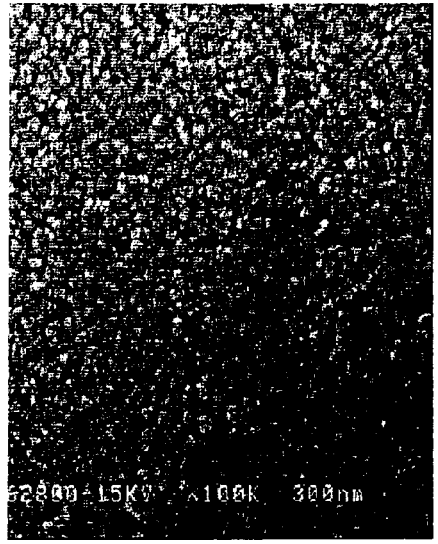
(a) sampleA (1.0Pa)
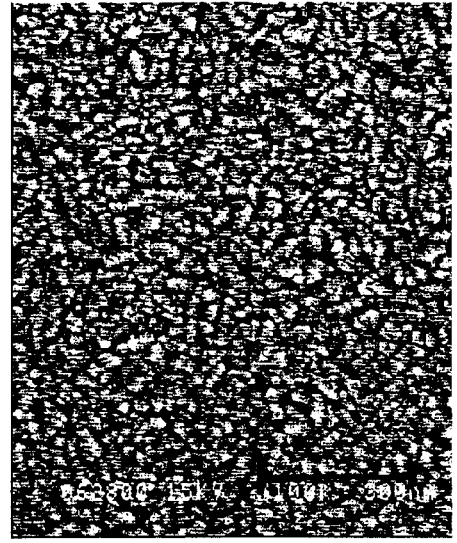
(b) sampleB (3.5Pa)
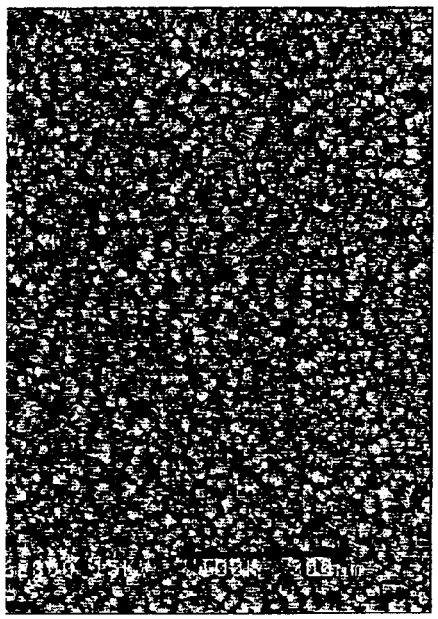
(c) sampleC (5.0Pa)
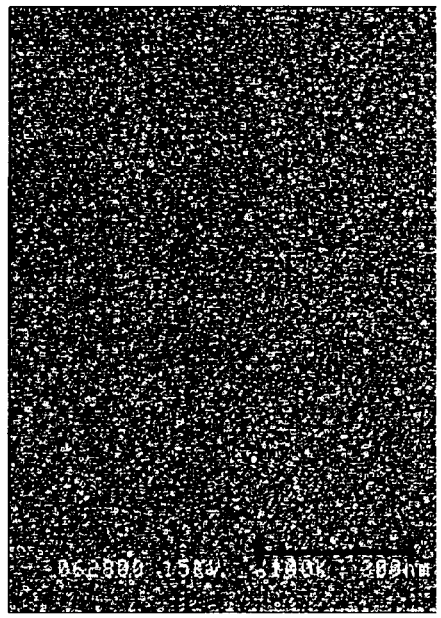
(d) sampleD (5.0Pa)
Thickness of $TiO_2$: 135[nm](sampleA-C)
50[nm](sample)
FIG.6

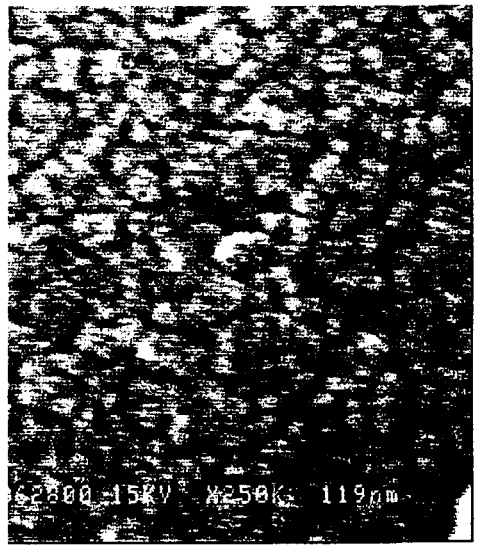 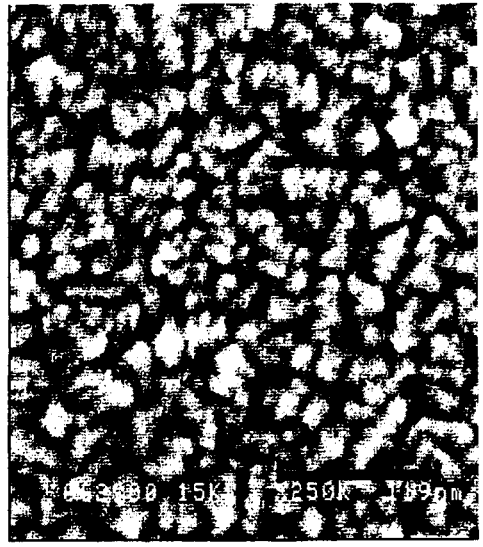
(a) sampleA (1.0Pa)   (b) sampleB (3.5Pa)
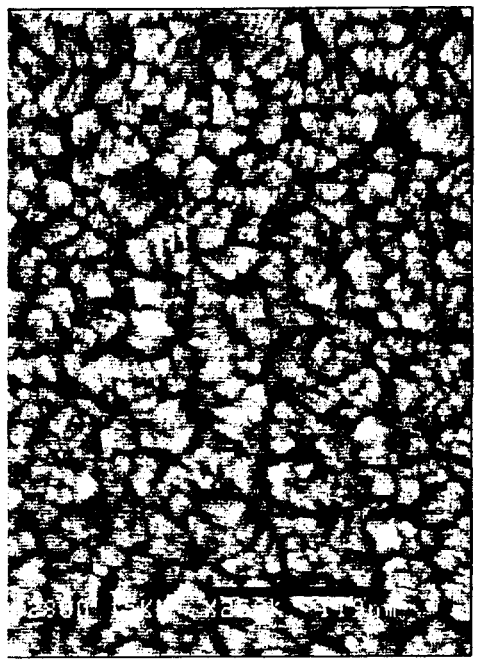 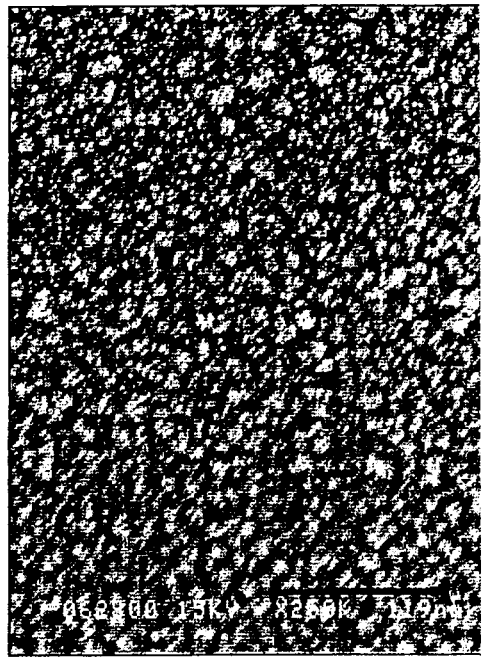
(c) sampleC (5.0Pa)   (d) sampleD (5.0Pa)
Thickness of TiO$_2$: 135[nm](sampleA-C)
　　　　　　　　　50[nm](sampleD)
FIG.7

| | Oxygen partial pressure [%] | Total pressure [Pa] | Film formation rate [nm/s] | Temperature [°C] | Film thickness [nm] | Ra [nm] | Contact angle [deg] | Judgment |
|---|---|---|---|---|---|---|---|---|
| Example 1 | 10 | 3 | 0.3 | 250 | 50 | | 5 | Qualified |
| Example 2 | | | | 330 | | | 2.3 | Qualified |
| Example 3 | | | | 300 | | | 4 | Qualified |
| Example 4 | | | 0.6 | 330 | | | 5.2 | Qualified |
| Example 5 | | 5 | 0.3 | 250 | | | 6 | Qualified |
| Example 6 | | | | 330 | | | 3 | Qualified |
| Example 7 | | | | 300 | | | 3.2 | Qualified |
| Example 8 | | | 0.6 | 330 | | | 4.1 | Qualified |
| Example 9 | 30 | 3 | 0.3 | 250 | | | 0.5 | Qualified |
| Example 10 | | | | 330 | | | 3.9 | Qualified |
| Example 11 | | | | 300 | | 1.2 | 7.5 | Qualified |
| Example 12 | | | 0.6 | 330 | | | 8.4 | Qualified |
| Example 13 | | 5 | 0.3 | 250 | | | 4.3 | Qualified |
| Example 14 | | | | 330 | | | 5.7 | Qualified |
| Example 15 | | | | 300 | | 2.1 | 2.1 | Qualified |
| Example 16 | | | 0.6 | 330 | | | 4.1 | Qualified |
| Example 17 | 30 | 5 | 0.6 | 330 | 40 | | 5.7 | Qualified |
| Example 18 | 30 | 5 | 0.34 | 300 | 80 | | 9 | Qualified |
| Example 19 | 30 | 5 | 0.34 | 300 | 90 | | 5.2 | Qualified |
| Example 20 | 30 | 3.5 | 0.4 | 300 | 100 | | 1 | Qualified |
| Example 21 | 30 | 3.5 | 0.4 | 300 | 135 | | 7.5 | Qualified |
| Example 22 | 30 | 3.5 | 0.4 | 300 | 170 | | 5.4 | Qualified |
| Example 23 | 30 | 5 | 0.23 | 330 | 50 | | 4.6 | Qualified |
| Example 24 | 30 | 3.5 | 0.34 | 330 | 50 | | 5.7 | Qualified |
| Example 25 | 30 | 3.5 | 0.38 | 330 | 50 | | 4.7 | Qualified |
| Example 26 | 30 | 3 | 0.3 | 330 | 50 | | 3.9 | Qualified |
| Example 27 | 30 | 3.5 | 0.4 | 330 | 50 | | 3 | Qualified |
| Example 28 | 30 | 5 | 0.6 | 330 | 50 | | 4.1 | Qualified |
| Example 29 | 10 | 3.5 | 0.6 | 330 | 50 | | 4 | Qualified |
| Example 30 | 20 | 3.5 | 0.5 | 330 | 50 | | 4.7 | Qualified |
| Example 31 | 30 | 3.5 | 0.4 | 330 | 50 | | 2.4 | Qualified |

FIG.15

| | Oxygen partial pressure [%] | Total pressure [Pa] | Film formation rate [nm/s] | Temperature [°C] | Film thickness [nm] | Ra [nm] | Contact angle [deg] | Judgment |
|---|---|---|---|---|---|---|---|---|
| Comparative Example 1 | 10 | 3 | 0.3 | 150 | 50 | | 19.3 | unqualified |
| Comparative Example 2 | | 3 | 0.6 | 150 | | | 21.3 | unqualified |
| Comparative Example 3 | | | 0.7 | 330 | | | 22.4 | unqualified |
| Comparative Example 4 | | | 0.3 | 250 | | | 19.5 | unqualified |
| Comparative Example 5 | | 1 | 0.6 | 330 | | | 30 | unqualified |
| Comparative Example 6 | | | 0.3 | 300 | | | 44 | unqualified |
| Comparative Example 7 | | 6 | 0.6 | 330 | | | 55.6 | unqualified |
| Comparative Example 8 | 30 | 3 | 0.3 | 150 | 50 | | 49.4 | unqualified |
| Comparative Example 9 | | | 0.6 | 150 | | | 31.5 | unqualified |
| Comparative Example 10 | | | 0.7 | 330 | | | 60 | unqualified |
| Comparative Example 11 | | | 0.3 | 250 | | | 41.3 | unqualified |
| Comparative Example 12 | | 1 | 0.6 | 330 | | | 55 | unqualified |
| Comparative Example 13 | | | 0.3 | 300 | | | 43.2 | unqualified |
| Comparative Example 14 | | 6 | 0.6 | 330 | | | 34.7 | unqualified |
| Comparative Example 15 | 5 | 3 | 0.3 | 250 | 50 | | 33.2 | unqualified |
| Comparative Example 16 | | | 0.3 | 330 | | | 43.1 | unqualified |
| Comparative Example 17 | | | 0.6 | 300 | | | 65.8 | unqualified |
| Comparative Example 18 | | | 0.6 | 330 | | | 53.5 | unqualified |
| Comparative Example 19 | 40 | 5 | 0.3 | 250 | | | 35.7 | unqualified |
| Comparative Example 20 | | | 0.3 | 330 | | | 31 | unqualified |
| Comparative Example 21 | | | 0.6 | 300 | | | 46.8 | unqualified |
| Comparative Example 22 | | | 0.6 | 330 | | | 40.1 | unqualified |
| Comparative Example 23 | 30 | 5 | 0.34 | 330 | 20 | | 64.9 | unqualified |
| Comparative Example 24 | 30 | 5 | 0.34 | 330 | 30 | | 17.7 | unqualified |
| Comparative Example 25 | 30 | 1 | 0.37 | | 50 | | 15.9 | unqualified |
| Comparative Example 26 | 30 | 2 | 0.3 | | 50 | | 13.1 | unqualified |
| Comparative Example 27 | 30 | 6 | 0.58 | 330 | 50 | | 85.9 | unqualified |
| Comparative Example 28 | 0 | | 6.73 | 330 | 50 | | 98 | unqualified |
| Comparative Example 29 | 40 | 3.5 | 0.38 | | | | 14.5 | unqualified |
| Comparative Example 30 | 50 | | 0.35 | | | | 20 | unqualified |
| Comparative Example 31 | 60 | | 0.35 | | 50 | | 24.5 | unqualified |
| Comparative Example 32 | 80 | | 0.34 | | | | 24.3 | unqualified |
| Comparative Example 33 | 100 | | 0.34 | 330 | | | 28.3 | unqualified |

FIG.16

PHOTOCATALYST ELEMENT, METHOD AND DEVICE FOR PREPARING THE SAME

TECHNICAL FIELD

The invention relates to a photocatalyst, a photocatalyst production method, a photocatalyst production apparatus and particularly to a photocatalyst having a photocatalytic function of promoting generation of active species by light radiation, a photocatalyst production method and a photocatalyst production apparatus.

BACKGROUND ART

Recently, a photocatalytic thin body using titanium oxide has drawn attraction. "Photocatalyst" is a substance having semiconductive physical properties, excited when light with energy higher than the band gap energy between the conduction electron band and charged electron band is radiated, and thereby producing electron-positive hole pairs.

Titanium dioxide with anatase type crystal structure is photo-excited by radiating light with wavelength of 387 nm or shorter and simultaneously causes decomposition reaction based on redox reaction and reaction for hydrophilization reaction different from the decomposition reaction (activation). So far, as a metal oxide simultaneously causing these two reactions, titanium oxide, tin oxide, and zinc oxide have been known and as a metal oxide causing only decomposition reaction, strontium titanate and ferric oxide and as a metal oxide causing only the hydrophilization reaction, tungsten trioxide have been known, respectively.

Self-washing function, deodorization function, anti-bacterial function and the like can be provided by utilizing the above-mentioned reactions and a variety of members and groups of products coated with such a photocatalyst have been proposed.

As a method for producing such a photocatalyst, various methods such as a binder method, a sol-gel method, and a vacuum evaporation method have been proposed.

The binder method involves steps of dispersing finely granular titanium oxide in a binder having an adhesive property, applying the obtained dispersion to a predetermined substrate and heating and drying the applied dispersion. However, the method has a problem that since the finely granular titanium oxide is buried in the binder, the catalytic function tends to be deteriorated.

The sol-gel method is a method for obtaining a photocatalytic film by applying a liquid-phase agent containing a titanium chelate or a titanium alkoxide containing titanium to a predetermined substrate, drying and then firing the agent at a temperature as high as 500° C. or higher. However, the method has a problem that since it requires the firing step at a temperature as high as 500° C. or higher, materials usable as the substrate are considerably limited in terms of the heat resistance.

Besides these formation methods, formation methods by using a vacuum evaporation method or sputtering method have been proposed.

For example, in JP Patent No. 2,901,550, a photocatalyst) having a layered structure of titanium oxide and silicon oxide by a vacuum evaporation method is disclosed.

Also, in Japanese Patent Application Laid-Open No. 2000-126613, a method for depositing silicon oxide by reactive sputtering is disclosed.

Meanwhile, on the basis of evaluation results of various physical properties of titanium oxide films formed under variously different conditions by sputtering, the inventors of the invention have found that a titanium oxide film formed under conditions different from those of conventional methods has a particular structure different from conventional structures. The inventors have found that with respect to such a titanium oxide film, the photocatalytic property is remarkably improved as compared with that of a conventional film.

The invention is accomplished based on such findings and an object of the invention is to provide a photocatalyst having an excellent photocatalytic property and simultaneously having a good dark place retention property and improved productivity, a photocatalyst production method and a photocatalyst production apparatus.

DISCLOSURE OF THE INVENTION

A first photocatalyst of the invention comprises a photocatalytic film of a compound of titanium and oxygen and is characterized in that the photocatalytic film is formed to be porous and has 0.02 or higher as a value calculated by dividing the arithmetical mean deviation of profile Ra with the film thickness.

The arithmetical mean deviation of profile Ra of the photocatalytic film may be 1.3 nm or more.

A second photocatalyst of the invention comprises a photocatalytic film of a compound of titanium and oxygen and is characterized in that the photocatalytic film is formed to be porous and has 5 or less as the intensity ratio of the (101) diffraction peak of the anatase structure of titanium oxide to the (112) diffraction peak of the anatase structure of titanium oxide.

A third photocatalyst of the invention comprises a photocatalytic film of a compound of titanium and oxygen and is characterized in that the photocatalytic film is formed to be porous and has 100 or less as the intensity ratio of the (101) diffraction peak of the anatase structure of titanium oxide to the (112) diffraction peak of the anatase structure of titanium oxide.

In all of the above-mentioned photocatalysts, the film thickness of the photocatalytic film may be not thinner than 40 nm and not thicker than 100 nm.

A buffer layer of silicon oxide may further be formed under the photocatalytic film.

The refractive index of the photocatalytic film may be 2.7 or lower.

A silicon oxide film may be formed on the photocatalytic film.

In that case, the thickness of the silicon oxide film is not thinner than 3 nm and not thicker than 7 nm.

A photocatalyst production method of the invention is a method for producing a photocatalyst comprising a photocatalytic film of a compound of titanium and oxygen and is characterized by including a step of depositing the photocatalytic film at a film formation rate of 0.6 nm/s or lower by sputtering a titanium-containing target in oxygen-containing atmosphere.

The above-mentioned deposition may be carried out at a temperature satisfying the following inequality:

$$R \leq 2.36 \exp(-410(1/T))$$

where T denotes a temperature of the surface to deposit the photocatalytic film thereon.

A second photocatalyst production method of the invention is a method for producing a photocatalyst comprising a photocatalytic film of a compound of titanium and oxygen and is characterized by including a step of depositing the photocatalytic film by sputtering a titanium-containing target in oxygen-containing atmosphere at not lower than 3 Pa and not higher than 5 Pa.

A third photocatalyst production method of the invention is a method for producing a photocatalyst comprising a photocatalytic film of a compound of titanium and oxygen and is characterized by including a step of depositing the photocatalytic film by sputtering a titanium-containing target in atmosphere containing oxygen not less than 10% and not more than 30%.

In the first to third photocatalyst production methods, prior to the deposition of the photocatalytic film, a buffer layer of silicon oxide may be deposited.

Further, a step of depositing silicon oxide on the photocatalytic film may be added.

A photocatalyst production apparatus of the invention is an apparatus for producing a photocatalyst comprising a photocatalytic film of a compound of titanium and oxygen, the apparatus comprising a first film formation chamber capable of keeping atmosphere at a reduced pressure lower than the atmospheric pressure; an electric power source for applying voltage to a target installed in the first film formation chamber; heating means for heating a substrate; a gas introduction mechanism for introducing a reaction gas containing oxygen into the first film formation chamber; and a controller capable of controlling the heating means, and is characterized in that, at the time of forming the photocatalytic film of a compound of titanium and oxygen by sputtering in the first film formation chamber, the controller controls the heating means so as to satisfy the following inequality:

$$R \leq 2.36 \exp(-410(1/T)):$$

between the film formation rate R of the photocatalytic film and the surface temperature T of the substrate.

The controller may control the gas introduction mechanism so as to keep the pressure of the first film formation chamber at not lower than 3 Pa and not higher than 5 Pa at the time of forming the photocatalytic film by sputtering.

Further, the controller may control the gas introduction mechanism so as to keep the oxygen content in the first film formation chamber not less than 10% and not more than 30% at the time of forming the photocatalytic film by sputtering.

The apparatus may further comprise a heating chamber having the heating means and a transporting mechanism for transporting the substrate from the heating chamber to the first film formation chamber, and formation of the photocatalytic film by sputtering may be carried out after the substrate is heated in the heating chamber and then transported to the first film formation chamber by the transporting mechanism.

The apparatus may further comprise a second film formation chamber capable of forming a silicon oxide film and is enabled to form a silicon oxide on the substrate prior to the formation of the photocatalytic film by sputtering.

The apparatus may further comprise a third film formation chamber capable of forming a silicon oxide film and is enabled to form a silicon oxide on the photocatalytic film after the formation of the photocatalytic film by sputtering.

BRIEF DESCRIPTION OF THE DRAWINGS

FIG. 6 is an electron microscopic photograph of the surface of a photocatalytic film obtained by reactive sputtering.

FIG. 7 is an electron microscopic photograph of the surface of a photocatalytic film obtained by reactive sputtering.

FIG. 15 is a collective table showing the film formation conditions for photocatalytic films of Examples carried out by DC sputtering by the inventors.

FIG. 16 is a collective table showing the film formation conditions for photocatalytic films of Comparative examples carried out by DC sputtering by the inventors.

BEST MODE FOR CARRYING OUT THE INVENTION

The invention will be described in details with reference to the accompanying drawings.

Based on results of the examinations and investigations, the inventors of the invention have found that the activity can remarkably be improved if a photocatalytic material such as titanium oxide was made porous. Such a porous photocatalytic material can be obtained by employing a reactive sputtering method and considerably increasing the film formation rate as compared with that in a conventional method and at the same time properly adjusting film formation parameters such as the sputtering pressure and the substrate temperature in proper ranges and particular physical properties different from those of a conventional material can be obtained.

Further, if such a porous photocatalytic material is coated with a silicon oxide with a predetermined film thickness, the surface can efficiently be protected without actual interference of the photocatalytic function and at the same time the material is provided with excellent sustainability-in-dark place.

Hereinafter, embodiments of the invention will be described more in detail with reference of concrete examples.

First Embodiment

As a first embodiment of the invention, a porous photocatalytic film and its production method will be described.

Figure 1:
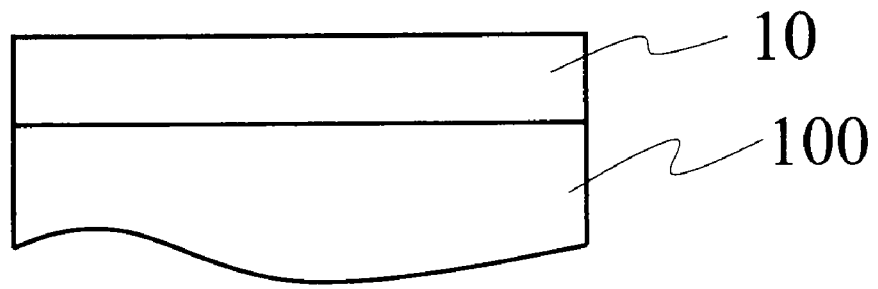
FIG. 1 is a schematic view exemplifying the structure of a photocatalyst according to an embodiment of the invention.

FIG. 1 is a schematic view exemplifying the structure of a photocatalyst of the embodiment of the invention.

That is, a photocatalyst of the invention comprises a photocatalytic film 10 formed in a thin film on a predetermined substrate 100. As the material of the photocatalytic film 10, titanium oxide (TiO$_x$) is used, and in the invention, the photocatalytic film 10 of titanium oxide is formed to be porous.

Figure 2:
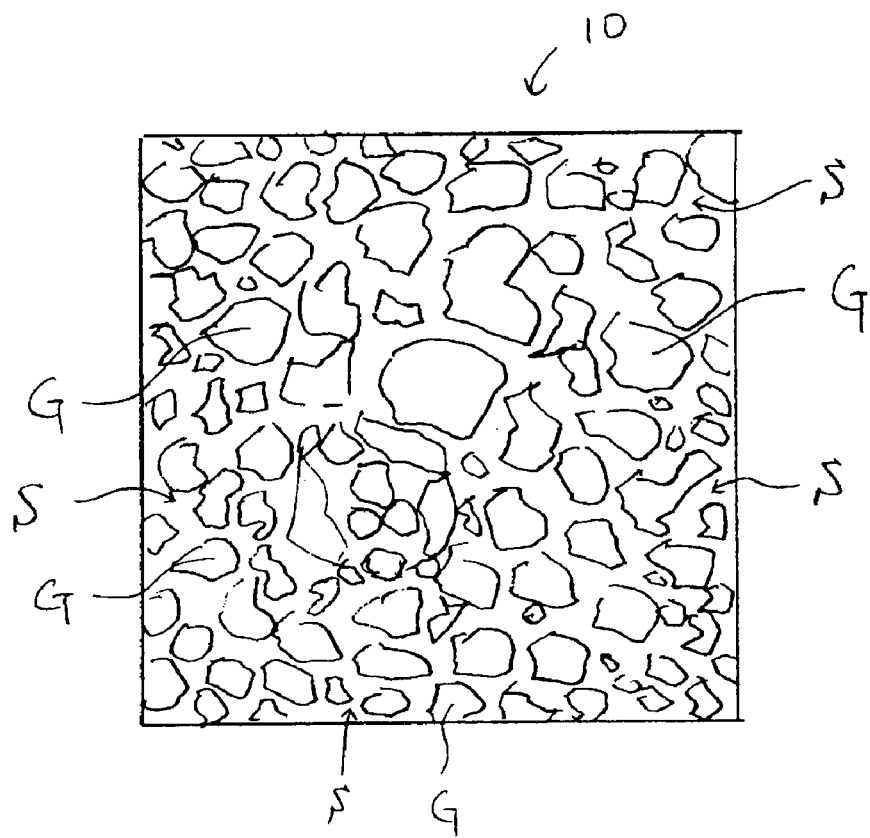
FIG. 2 is a schematic view showing the surface of a photocatalytic film 10.

FIG. 2 is a schematic view showing the surface state of the photocatalytic film 10. That is, the figure shows the surface of the photocatalytic film of titanium oxide in a film thickness of 135 nm on a substrate. A large number of granules G with a size of 10 nm or smaller are observed in the surface and these granules are not densely packed but gaps S are kept among the granules.

Figure 3:
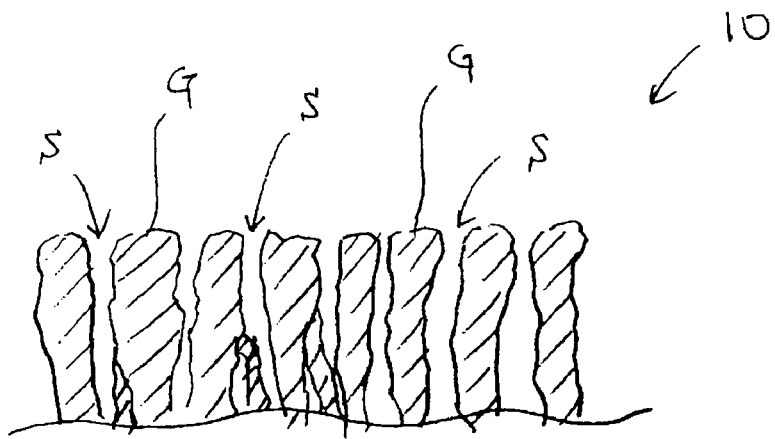
FIG. 3 is a schematic view exemplifying the cross-sectional structure of a photocatalyst 10.

FIG. 3 is a schematic view exemplifying the cross-sectional structure of the photocatalyst 10. As shown in the figure, the gaps S are formed among the numberless granules G and a film structure with an extremely high surface area is obtained.

Such a porous photocatalytic film 10 shows a remarkably excellent photocatalytic function as compared with that of a conventional one.

Hereinafter, the photocatalytic film of the invention will be described more in details with reference to its production method.

The photocatalytic film of the invention can be formed by a reactive sputtering method.

Figure 4:
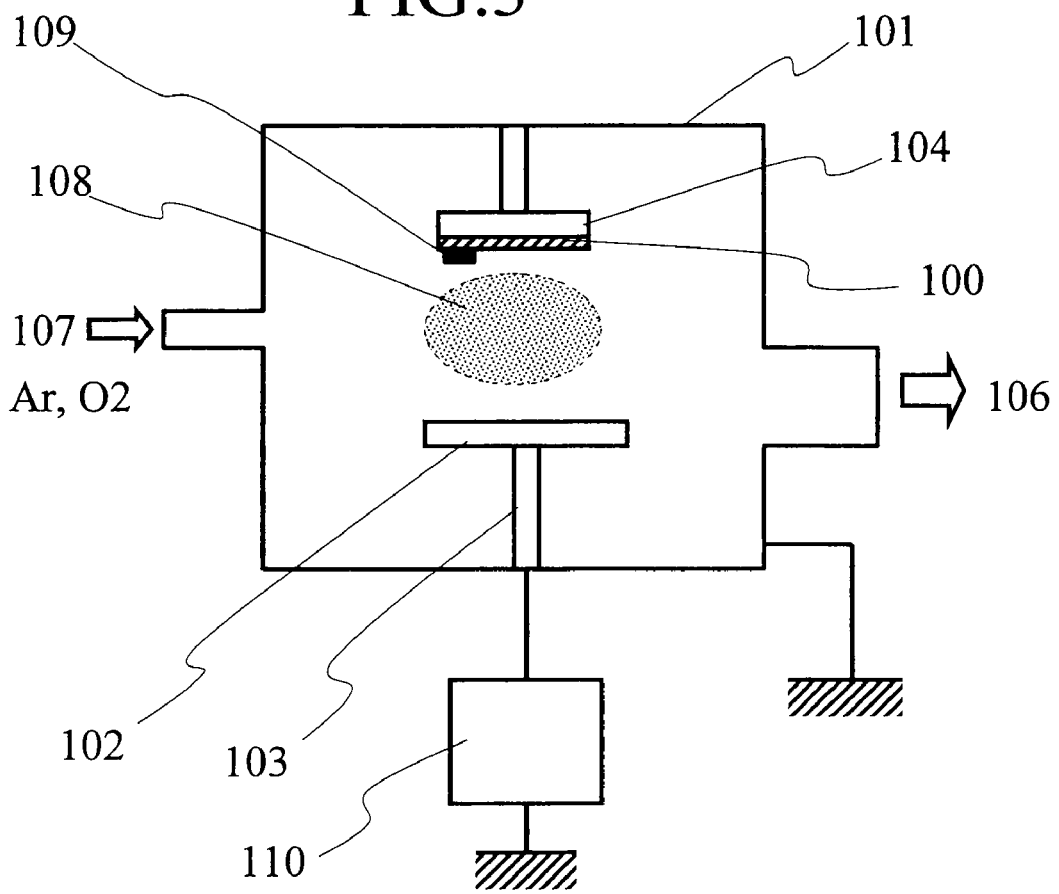
FIG. 4 is a schematic view showing the main part configuration of a sputtering apparatus employed for experiments.

FIG. 4 is a schematic view showing the main part configuration of a sputtering apparatus employed for experiments. That is, while being connected with a cathode 103, a target 102 made of metal titanate is installed in the inside of a vacuum chamber 101. On the other hand, a substrate 100 to deposit the photocatalytic film thereon is installed in an anode 104 side.

At the time of film formation, at first the chamber 101 is evacuated to be in a vacuum state by a vacuum gas discharge pump 106 and discharge gases of argon (Ar) and oxygen (O$_2$) are introduced from a gas supply source 107. An electric field is applied between the anode 104 and the cathode 103 from an electric power source 110 to start plasma discharge 108. Subsequently, the surface of the target 102 is sputtered and the metal titanium and oxygen are bonded on the substrate 100 to form a titanium oxide film 10. In this case, the electric power to be loaded from the electric power source 110 may be DC (direct current) power or RF (radio frequency) power.

In a concrete example to be described hereinafter, a photocatalytic film is formed by a DC sputtering method by employing a DC power source unless specific remark is given.

Further, at the time of sputtering, the substrate 100 is kept in a floating state relatively to the chamber 101 (at a ground potential).

As it will be described later, in such a sputtering apparatus, a photocatalytic film with a predetermined film quality can be obtained by adjusting the electric power loaded for plasma discharge, the pressure and the composition of the ambient gas at the time of sputtering, and the temperature of the substrate.

The temperature of the substrate 100 is confirmed by sticking a thermo-label 109 to the substrate.

Figure 5:
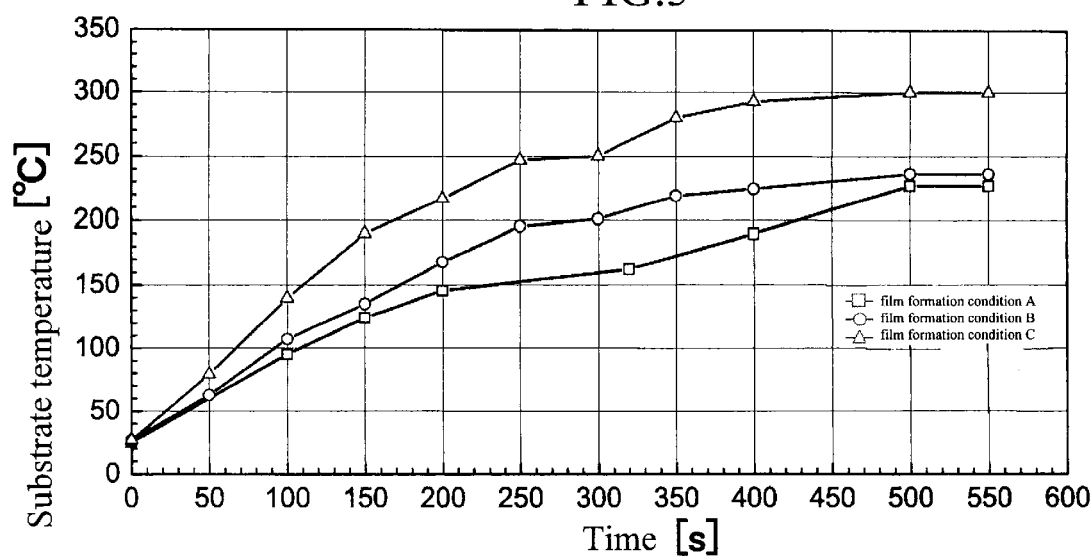
FIG. 5 is a graph exemplifying the temperature fluctuation of a substrate 100 during the sputtering.

FIG. 5 is a graph exemplifying the temperature fluctuation of the substrate 100 during the sputtering. Here, the substrate temperature fluctuation from a room temperature to the temperature at the time of starting sputtering is shown for the film formation conditions A to C. The respective conditions are as follows.

| Condition | Loaded DC electric power | Deposition rate | Total pressure | Oxygen partial pressure |
|---|---|---|---|---|
| A | 2 kW | 18 nm/min | 1 Pa | 30% |
| B | 2 kW | 22 nm/min | 3.5 Pa | 30% |
| C | 3 kW | 36 nm/min | 5 Pa | 30% |

As can be seen from FIG. 5, in the case of starting sputtering at a room temperature as the substrate temperature, the temperature of the substrate 100 tends to be increased with the lapse of time owing to the heat radiation from the sputtering source and reaches a saturated temperature depending on the loaded electric power.

The saturated temperature depends on mainly the loaded electric power and in the case where the electric power is 2 kW, it is about 230° C. and in the case where the electric power is 3 kW, it is about 300° C.

Incidentally, the deposition of the thin film is sometimes finished before the temperature reaches the saturated temperature. For example, the deposition rate of Condition C is 36 nm/min and it takes 3 minutes and 45 seconds to form a titanium oxide film with a film thickness of 135 nm, so that the highest substrate temperature in the case of starting the deposition from the room temperature is about 230° C. On the other hand, before sputtering, the substrate may be heated previously for degassing treatment and the sputtering may be started in a state at a temperature higher than a room temperature. In such a case, since the temperature increases close to the saturated temperature from the raised state, in the case of previous heating to a high temperature, the temperature may be decreased toward the saturated temperature during the deposition in some cases.

FIGS. 6 and 7 are electron microscopic photographs of the surfaces of photocatalytic films obtained by such reactive sputtering. That is, these FIGS. 6(a) to 6(d) and FIGS. 7(a) to 7(d) are surface photographs of respective Samples A to D of titanium oxide films.

FIGS. 6 and 7 are photographs of a single sample with different magnifications and the length of the bars in the right bottom of the respective photographs is equivalent to 300 nm in FIG. 6 and 119 nm in FIG. 7.

Sample A, Sample B, and Sample C are formed in the above-mentioned Condition A, Condition B, and Condition C, respectively. Each of Samples is obtained by depositing titanium oxide as a photocatalytic film on a $SiO_2$ butter layer on a silicon wafer used as the substrate 100 and the film thickness of titanium oxide 10 is 135 nm for Samples A to C and 50 nm for Sample D.

From FIGS. 6 and 7, the surface of Sample A has a structure in which fine particles are closely agglomerated and the particles are densely packed.

On the other hand, in the surfaces of Samples B to D, numberless particles with a diameter of about 10 nm or smaller are observed, however they are not densely packed and kept from one another at gaps. That is, they are formed to be porous.

That the particles of Sample D are smaller than those of Samples B and C is supposedly greatly attributed to the difference of the film thickness.

The photocatalytic function of the photocatalytic film 10 obtained in such a manner was evaluated by "wax decomposition hydrophilization test". The test is for evaluating both of "decomposition function" and "hydrophilization function" together among photocatalytic functions which the photocatalytic film 10 has. The "decomposition function" is a function of decomposing an organic material such as a wax by active oxygen species such as hydroxy radical and superoxide formed in the surface of the photocatalytic film. The "hydrophilization function" is a function of improving the hydrophilicity of the surface of the photocatalytic film. The contents of the wax decomposition hydrophilization test carried out by the inventors are approximately as follows.

(1) Making the surface of the photocatalytic film 10 hydrophilic by washing with a neutral detergent.

(2) Applying a solid wax to the surface of the photocatalytic film 10 and drying the wax at a room temperature for 1 hour. The solid wax used in this case is Hero (trade name, manufactured by SurLuster Inc.) of mainly carnauba wax.

(3) Washing the surface of the photocatalytic film 10 with a neutral detergent and then drying the surface at 50° C.

(4) Measuring the contact angle of water droplet formed on the surface of the photocatalytic film 10 periodically by continuously radiating black light beam (BLB). The wax formed on the surface of the photocatalytic film 10 is decomposed by the photocatalytic function by radiation of black light beam. In the state that the wax remains on the surface, the contact angle of the water droplet is high, however when the wax is decomposed, the contact angle of the water droplet becomes small.

Accordingly, it can be said that the photocatalytic function is more active as the decomposition is promoted more even if the radiation intensity of the black light beam is small or the contact angle of the water droplet is smaller after a predetermined duration of radiation.

Figure 8:
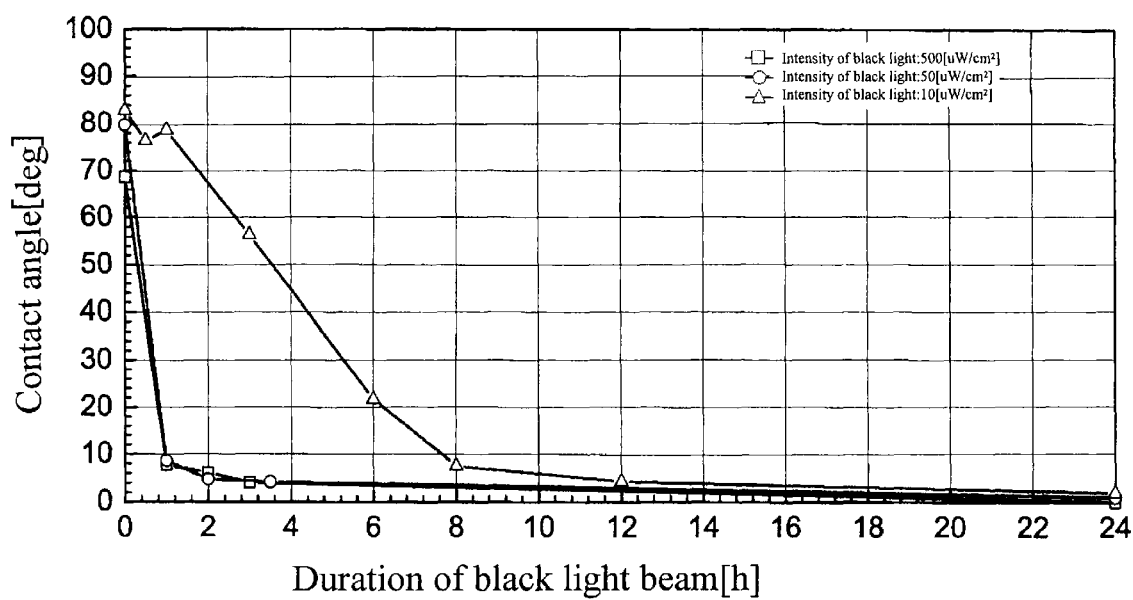
FIG. 8 is a graph exemplifying the results of a wax decomposition and hydrophilization test of the photocatalytic film 10 of the invention.

FIG. 8 is a graph exemplifying the results of the wax decomposition and hydrophilization test of the photocatalytic film 10 of the invention. Here, the data of Sample D described in description of FIGS. 5 to 7 is shown. The graph is formed by plotting the data obtained by changing radiation intensity of black light beam to be 500 $\mu W/cm^2$, 50 $\mu W/cm^2$, and 10 $\mu W/cm^2$.

The radiation intensity, 500 $\mu W/cm^2$, is close to the condition of a wax decomposition hydrophilization test which is commonly carried out and the radiation intensity, 50 $\mu W/cm^2$, is rather slight intensity, and the radiation intensity, 10 $\mu W/cm^2$, is extremely slight intensity.

From FIG. 8, the contact angle is about 83 degrees before the black light beam radiation, meanwhile in the case of the radiation intensity of 500 $\mu W/cm^2$ and 50 $\mu W/cm^2$, the contact angle is sharply decreased as soon as black light beam is radiated and after 1 hour, it is decreased to about 9 degrees, after 2 hours, to about 5 degrees, and after 10 hours, to about 3 degrees and accordingly, it is understood that the wax is quickly decomposed.

Also, a further remarkable point is that the photocatalytic function is obtained even by the light radiation as ultra slight of 10 $\mu W/cm^2$ light radiation intensity. That is, although the contact angle decrease speed is moderate, after 3 hours, the contact angle is decreased to about 56 degrees, after 6 hours, to about 22 degrees, and after 12 hours, to about 4 degrees. As it will be described later, as compared with that of a conventional photocatalytic film, it is a remarkable characteristic of the photocatalytic film of the example that the photocatalytic function is obtained even by such an ultra slight light radiation.

The inventors of the invention formed photocatalytic films with various film qualities by variously adjusting the film formation conditions in the reactive sputtering method and evaluated the formed films. Hereinafter, relations between the physical properties of a photocatalytic film and the film formation parameters will be described successively.

At first, as one of parameters defining the "porosity" of a photocatalytic film, "surface roughness" of the film was investigated.

Figure 9:
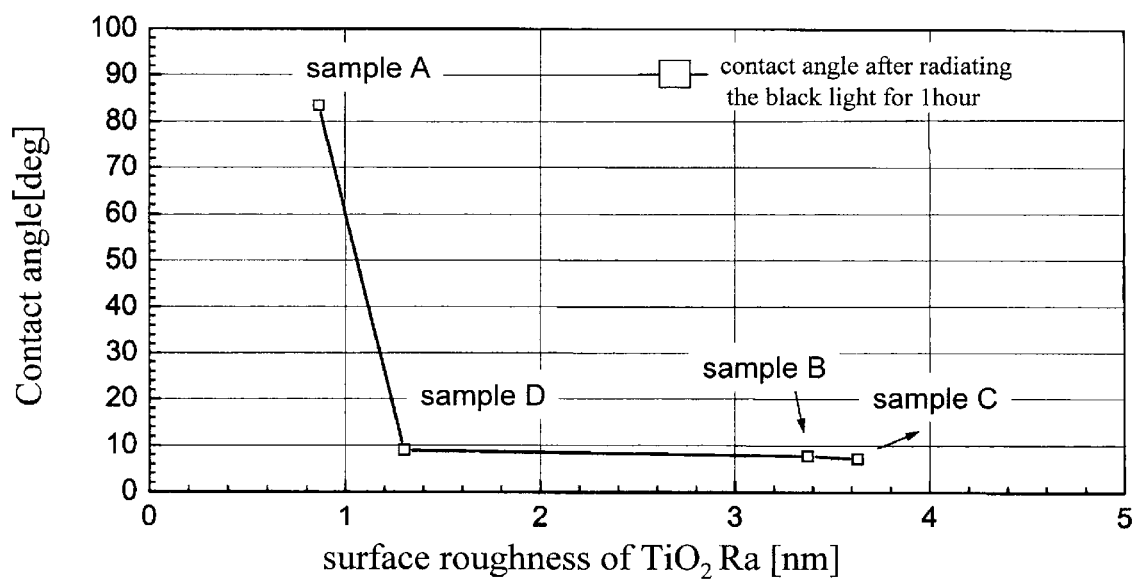
FIG. 9 is a graph showing the correlation between the surface roughness of the photocatalytic film and the contact angle measured by an AFM (Atomic Force Microscopy).

FIG. 9 is a graph showing the correlation between the surface roughness of the photocatalytic film and the contact angle measured by an AFM (Atomic Force Microscopy). That is, the axis of abscissa of the figure shows the surface roughness Ra of the photocatalytic film of titanium oxide. The axis of ordinate of FIG. 9 shows the contact angle of water droplet after 1-hour radiation of black light beam (radiation intensity 500 $\mu W/cm^2$) in the wax decomposition hydrophilization test similar to that described above.

Four samples A to D plotted in FIG. 9 are respectively same as Samples A to D described in relation to FIGS. 5 to 8.

From FIG. 9, in the case where the surface roughness Ra of the photocatalytic film (Sample A) is about 0.9 nm, the contact angle is found extremely high as about 83 degree, even if black light beam is radiated for 1 hour. On the other hand, in the case where the surface roughness Ra is 1.3 nm (Sample D), the contact angle is drastically decreased to 9 degrees in the same condition, in the case where the surface roughness Ra is 3.5 nm (Sample B), the contact angle is decreased to about 8 degrees, and in the case where the surface roughness Ra is 3.65 nm (Sample C), the contact angle is decreased to about 8 degrees.

In other words, it can be understood that if the surface roughness Ra is higher than 1 nm, the photocatalytic function is sharply improved.

With respect to the relations among the film formation condition, the film thickness, and the surface roughness, the following relations can be obtained.

| Sample | Deposition rate | Total pressure | Film thickness | Surface roughness |
|--------|-----------------|----------------|----------------|-------------------|
| A | 18 nm/min | 1 Pa | 135 nm | 0.9 nm |
| B | 22 nm/min | 3.5 Pa | 135 nm | 3.5 nm |
| C | 36 nm/min | 5 Pa | 135 nm | 3.65 nm |
| D | 36 nm/min | 5 Pa | 50 nm | 1.3 nm |

That is, the surface roughness Ra is increased mainly by increasing the "deposition rate" and the "total pressure". From the surface photographs of FIGS. 6 and 7, as described, it is found that the "gaps" among "particles" tend to be wide as the surface roughness Ra is higher.

Incidentally, as described in details in Examples, the deposition rates of Samples B to D are about 10 times as high or more than as compared with that in the case of photocatalytic film formation by a conventional reactive sputtering.

In other words, if the deposition rate is considerably increased as compared with that in a conventional case and the parameters such as the total pressure and the substrate temperature are adjusted as described above, a porous photocatalytic film can be obtained. The film thickness of Samples B to D is in a range of a common film thickness as a photocatalytic film. Accordingly, if the surface roughness Ra is higher than 1.3 nm, it is supposed that a porous thin film having an excellent photocatalytic function can be obtained.

The reason for that the surface roughness Ra of Sample D is smaller than that of Sample C formed in the same film formation condition is because the film thickness is different. Accordingly, with respect to the data of FIG. 9, normal distribution of the surface roughness Ra in relation to the film thickness is plotted.

Figure 10:
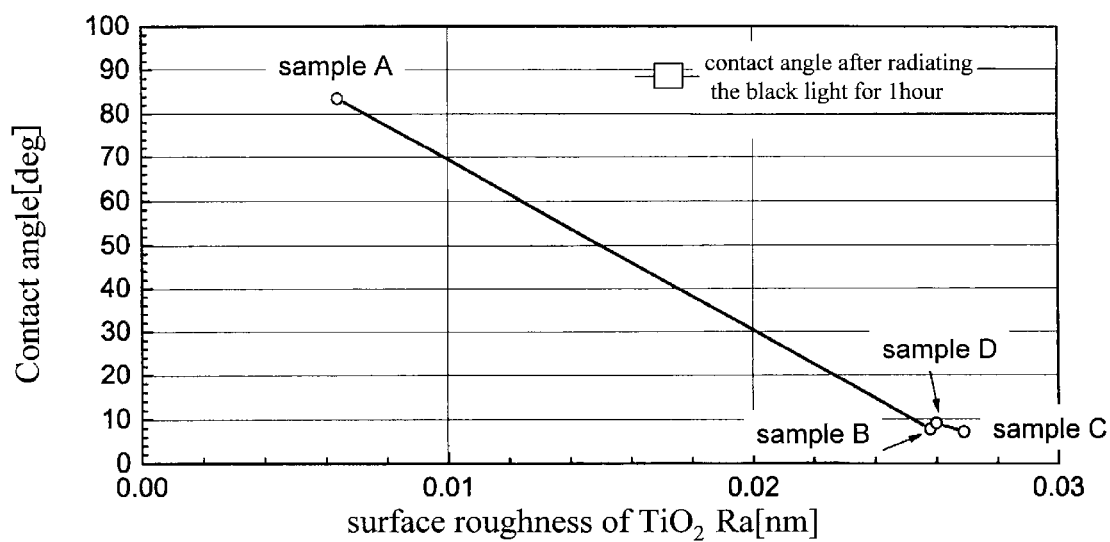
FIG. 10 is a graph formed by plotting the contact angle in relation to the value Ra/T calculated by dividing the surface roughness Ra with the film thickness of each of Samples A to D.

FIG. 10 is a graph formed by plotting the contact angle in relation to the value Ra/T calculated by dividing the surface roughness Ra with the film thickness of each of Samples A to D.

As it is understood from the figure, Ra/T of Sample A was about 0.0062 and Ra/T of Samples B to D was in a range of 0.026 to 0.027 and thus Ra/T was divided into two groups. In the case of the former (Sample A), the contact angle is as high as about 83 degrees after 1-hour radiation of black light beam, meanwhile in the case of the latter (Samples B to D), the contact angle is found drastically decreased to about 7 to 9 degrees.

If a range of 30 degrees or lower is defined to be the allowable range of the contact angle after 1-hour radiation of black light beam in the invention, it can be understood that the ratio of the surface roughness to the film thickness, that is, Ra/T should be 0.02 or higher. If a range of 10 degrees or lower is defined to be the allowable range in the invention, it can be understood that the ratio of the surface roughness to the film thickness, that is, Ra/T should be 0.02 r or higher.

Accordingly, in the invention, the density of a photocatalytic film to be formed can be lowered and a porous photocatalytic film comprising fine particles and having gaps among the particles can be formed by considerably increasing the deposition rate and adjusting the total pressure and the substrate temperature. It is found that such a porous photocatalytic film can drastically be improved in the photocatalytic properties if the surface roughness exceeds a predetermined value.

The reason for the activation of the photocatalytic function by increase of the porosity is supposedly attributed to that the surface area of the photocatalytic film is increase by making the film porous and defects advantageously functioning for the photocatalytic function are properly introduced into the vicinity of the surface of the particles.

According to the invention, since the film formation is carried out at a remarkably increased deposition rate as compared with that in a conventional case, the film formation time can considerably be shortened as an advantageous point. For example, in the case of forming a photocatalytic film with a film thickness of 200 nm, it conventionally takes 100 minutes, that is, 1 hour and 40 minutes, as the deposition time, meanwhile it can be shortened to be 10 minutes or shorter. As a result, the production throughput of the photocatalytic film can remarkably be improved and the cost can be lowered.

Further, according to the invention, since the film formation can be carried out at a lower substrate temperature than that of a conventional formation, the requirements for the heat resistance of a substrate can considerably be moderated. That is, various materials, e.g. organic materials such as plastics with low heat resistance, which cannot be used conventionally, can be usable and the application range of the photocatalytic film can remarkably be widened.

Hereinafter, a variety of the properties of the photocatalytic film of the invention can be described in relation to the film formation parameters.

Figure 11:
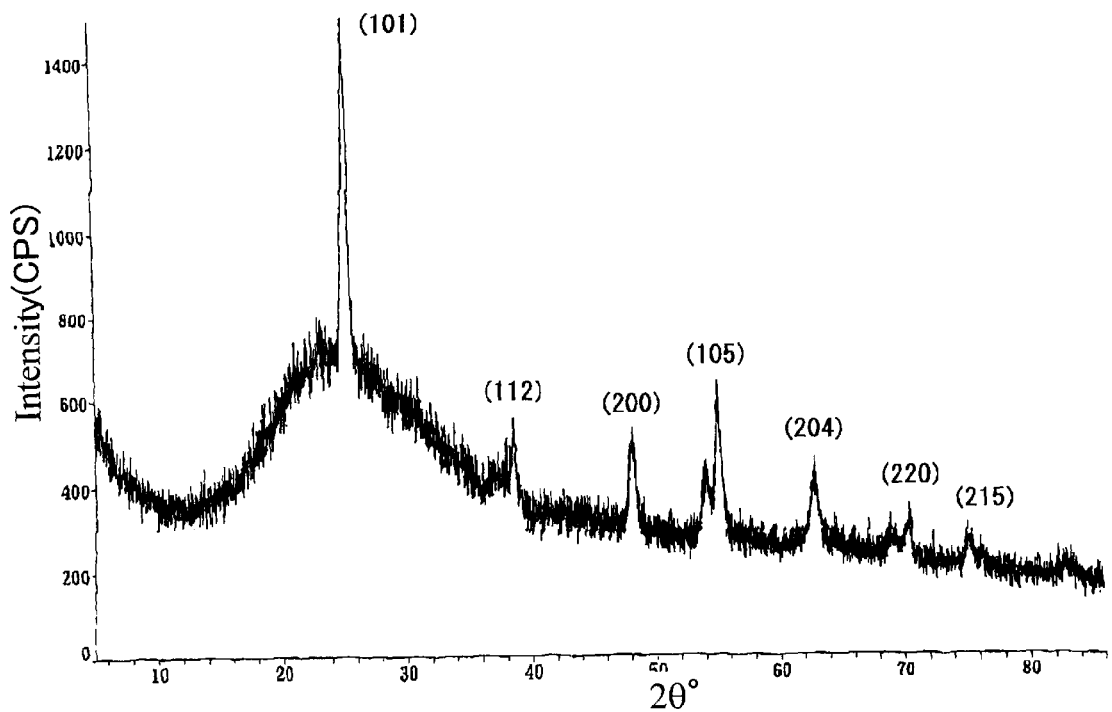
FIG. 11 is a graph showing an x-ray diffraction pattern of the photocatalytic film of Sample C.

FIG. 11 is a graph showing an x-ray diffraction pattern of the photocatalytic film of the above-mentioned sample C.

From the figure, it can be understood that the background level is rather high and the diffraction peak of $TiO_2$ is weak and broad. In other words, it can be assumed that the crystal is rather disordered and the crystal grains are also rather small and contain a large number of defects.

Figure 12:
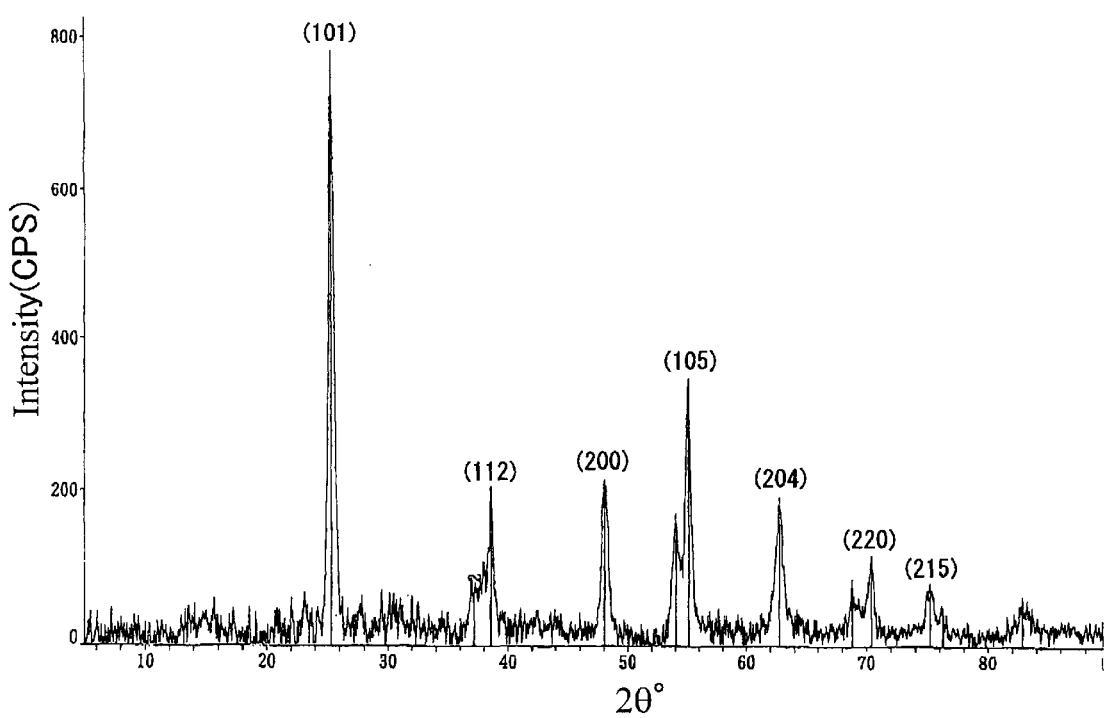
FIG. 12 is a diffraction pattern obtained after removing the background noise by data processing of the diffraction pattern of FIG. 10.

FIG. 12 is a diffraction pattern obtained after removing the background noise by data processing of the diffraction pattern of FIG. 11. The diffraction peak appearing in the figure corresponds to the diffraction peak of $TiO_2$ having an anatase structure and it is found that higher reflection is obtained.

Figure 13:
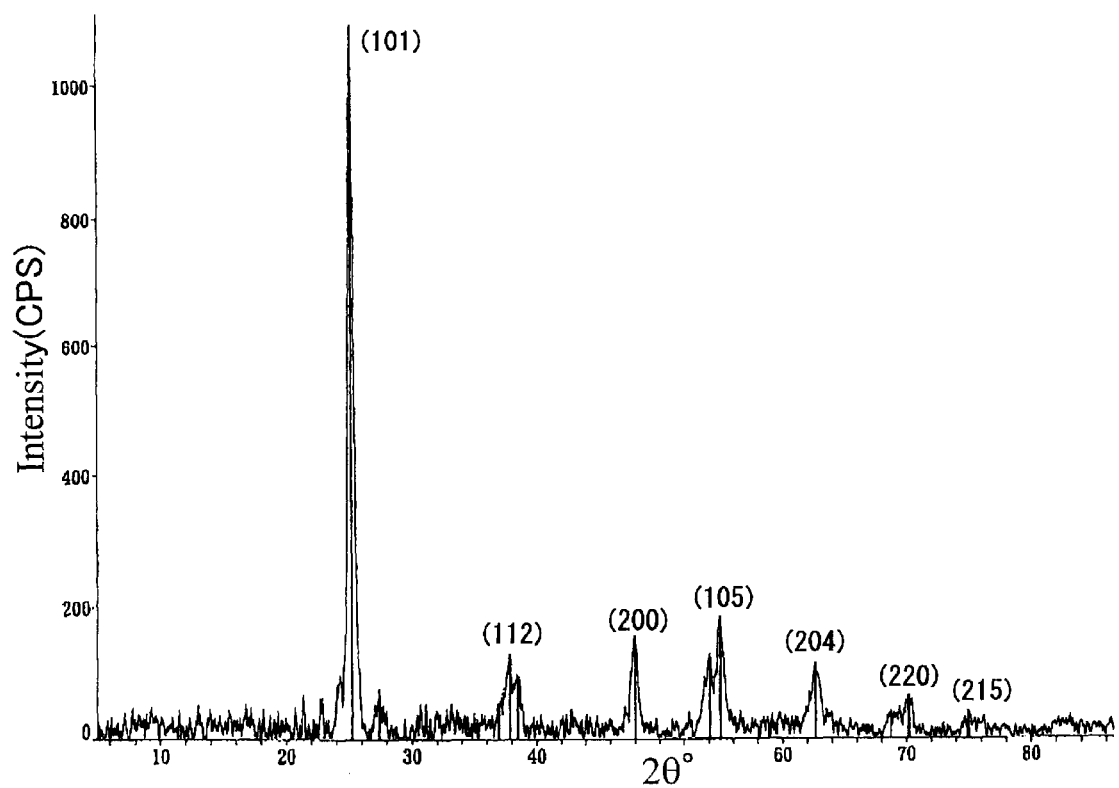
FIG. 13 is a graph obtained after measuring the x-ray diffraction pattern of the photocatalytic film of Sample A and similarly removing the background noise from the diffraction pattern.

FIG. 13 is a graph obtained after measuring an x-ray diffraction pattern of the photocatalytic film of the above-mentioned sample A and removing the background noise from the diffraction pattern.

From FIG. 13, the diffraction peak of $TiO_2$ with an anatase structure is also obtained, however in comparison with FIG. 12 (Sample C), the balance of the height of the appearing reflection peaks is found different. More particularly, for example, with respect to the intensity of another diffraction peak to the (101) diffraction peak of anatase appearing in the vicinity of the diffraction angle, 25 degrees, the relative intensity of the main peak is rather high in Sample A (FIG. 13) as compared with that in Sample C (FIG. 12).

The relative intensity ratios of the (101) diffraction peak to other main diffraction peak intensities are collectively shown below.

| Intensity ratio of diffraction peak | Sample A | Sample C |
|---|---|---|
| (101)/(112) | 10.4 | 3.8 |
| (101)/(200) | 7.5 | 3.7 |
| (101)/(105) | 6.3 | 2.2 |
| (101)/(204) | 10.7 | 3.9 |
| (101)/(215) | >300 | 9.6 |

From the above intensity ratio, the intensity ratios of the (101) diffraction peak of Sample A are overwhelmingly high and it can be understood that a thin film structure oriented in [110] direction is obtained. In comparison with that, in the case of Sample C, it can quantitatively be understood that the intensity ratios of the (101) diffraction peak are extremely low. That is, in Sample C, such orientation is low and accordingly, it can be assumed that agglomerates of a large number of crystal grains having disordered orientation relations are formed.

Also from the x-ray diffraction data, in the invention, it can be understood that since a photocatalytic film is deposited at a high speed, a high pressure, and a low temperature as compared with those in a conventional case, a porous thin film having a large number of defects is formed. Attributed to such a particular porous structure, the photocatalytic function is supposedly improved remarkably.

In consideration of the results (FIGS. 9 and 10) of the wax decomposition hydrophilization test, it is supposed to be desirable that the intensity ratio of the (101) diffraction peak to the (112) diffraction peak is about 5 or lower, the intensity ratio of the (101) diffraction peak to the (105) diffraction peak is about 4 or lower, and the intensity ratio of the (101) diffraction peak to the (215) diffraction peak is about 100 or lower.

Next, the dependency of the film quality on the total pressure at the time of sputtering will be described.

That is, a titanium oxide film was deposited in the condition that the loaded electric power and the oxygen partial pressure are fixed at 2 kW and 30%, respectively, at the time of sputtering and the refractive index and the density ratio were measured. The results are shown as follows.

| Total pressure | Refractive index N | Density ratio |
|---|---|---|
| 1 Pa | 2.73 | 1 |
| 2 Pa | 2.69 | 0.94 |
| 3 Pa | 2.63 | 0.88 |
| 5 Pa | 2.3 | 0.829 |

The above-mentioned refractive index was measured by an elipsometer using helium-neon (He—Ne) laser. The density ratio was evaluated by effective solute approximation of the spectroscopic elipsometer.

Figure 14:
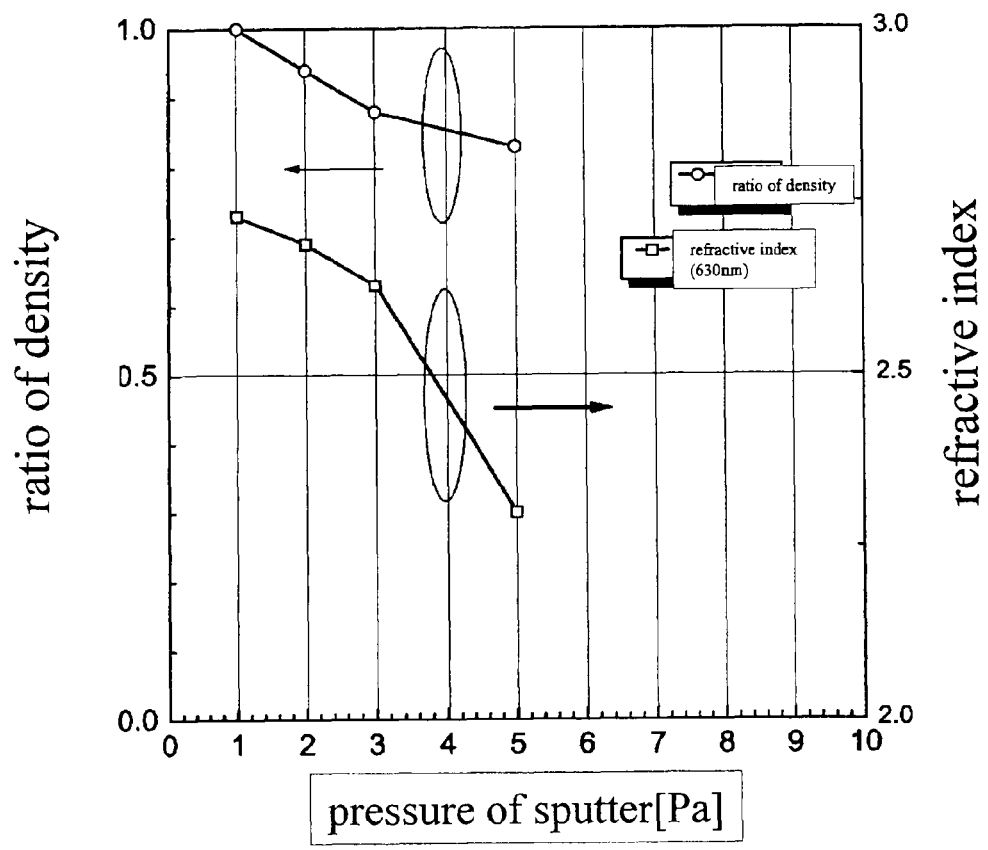
FIG. 14 is a graph obtained by plotting the refractive index and the density ratio in relation to the total pressure.

FIG. 14 is a graph obtained by plotting the refractive index and the density ratio in relation to the total pressure.

As it can be understood from the graph, if the total pressure is increased at the time of film formation, it is found that both of the refractive index and the density tend to be gradually decreased. That is supposedly attributed to the reflection of the tendency that the film quality of the porous photocatalytic film becomes coarser as the total pressure is increased more.

Separately, the composition of the photocatalytic film and the absolute value of the density of Sample B (film formed at the total pressure of 3.5 Pa) were measured by Rutherford back scattering analysis (RBS). The measurement conditions are as follows.

| Energy decomposition capability | 24 keV |
|---|---|
| Impinging energy | 2.0 MeV |
| Impingent angle | 0 degree |
| Impinging ion | 4 He$^+$ |
| Impinging beam diameter | 1.0 mm |
| Sample current | 10 nA |

The following results are obtained for Sample B by the RBS measurement.

| O/Ti | 2.02 |
|---|---|
| Density | 4.45 g/cm$^3$. |

The measurement precision of the O/Ti value is about ±5% and the measurement precision of the density is also about ±5%.

It is supposed that excellent photocatalyst properties as described above can be obtained by forming a photocatalytic film porous equal to or more than Sample B, that is decreasing the density. In other words, from the above-mentioned measurement results, if the density of the photocatalytic film is adjusted to be 4.45 g/cm$^3$ in the invention, a porous photocatalytic film excellent in the photocatalytic function can be obtained.

Next, the relation of the film formation conditions at the time of sputtering and the photocatalytic film properties will be described. The inventors of the invention formed a photocatalytic film by variously changing the conditions of the reactive sputtering carried out by using the above-mentioned DC sputtering apparatus and investigated the properties of formed films.

FIG. 15 is a collective table showing the film formation conditions of the photocatalytic films of Examples carried out by DC sputtering by the inventors.

Also, FIG. 16 is a collective table showing the film formation conditions of the photocatalytic films of Comparative examples carried out by DC sputtering by the inventors.

That is, in this case, relations between the parameters of the "oxygen partial pressure (%)", the "total pressure (Pa)", the "film formation rate (nm/second)", the "temperature (° C.)", and the "film thickness (nm)" and the properties of the formed photocatalytic films were investigated.

Here, the temperature at the time of sputtering is the average temperature during the sputtering after a substrate is heated previously in a preliminary chamber and then transported to a sputtering chamber. Argon (Ar) was used as a carrier gas at the time of sputtering.

As the evaluation method for the photocatalytic films, the wax decomposition hydrophilization test was carried out and those having a contact angle of water droplet 10 degree of lower after 1-hour radiation of black light beam with luminance of 500 μW/cm$^2$ were regarded as qualified and those having a contact angle higher than 10 degree were regarded as unqualified.

The effect of the oxygen partial pressure on the photocatalytic film at the time of sputtering will be described.

Figure 17:
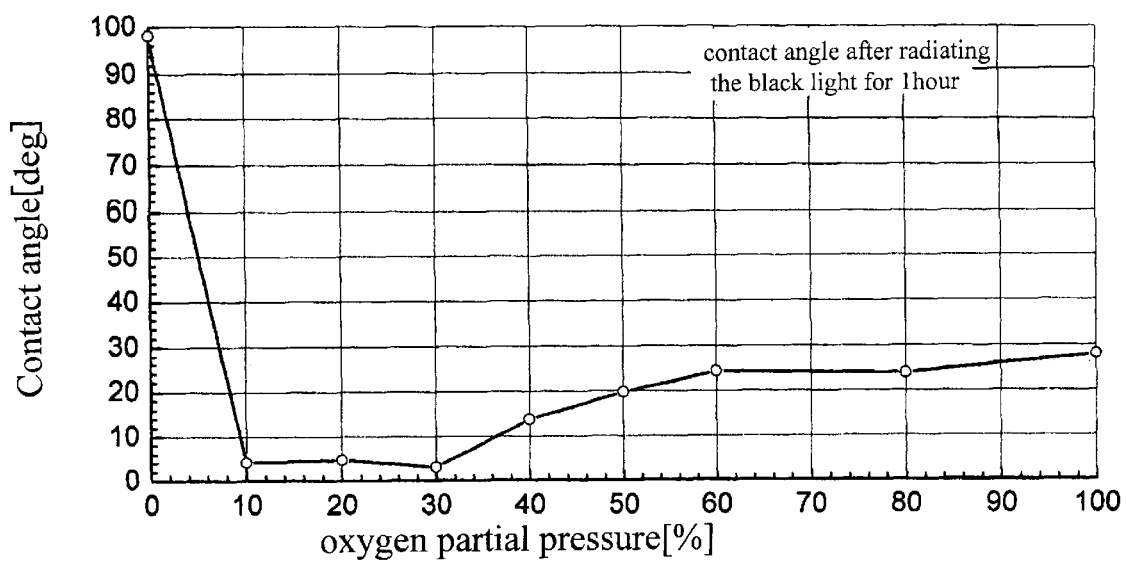
FIG. 17 is a graph showing the correlation between the oxygen partial pressure at the time of sputtering and the contact angle of the obtained photocatalytic film.

FIG. 17 is a graph showing the correlation between the oxygen partial pressure at the time of sputtering and the contact angle of the obtained photocatalytic film. That is, the axis of abscissa of the figure shows the oxygen partial pressure at the time of the reactive sputtering and the axis of ordinate shows the contact angle of water droplet after 1-hour radiation of black light beam (radiation intensity 500 μW/cm$^2$) in the wax decomposition hydrophilization test.

All of Samples plotted in FIG. 17 were formed by deposition in the conditions of the total pressure of 5 Pa, DC loaded electric power of 2 kW, the film formation speed of 0.3 nm/second, the temperature of 330° C., and the film thickness of 50 nm at the time of sputtering.

From FIG. 17, it can be understood that the contact angle is extremely low and remarkably excellent photocatalytic function can be obtained in the condition that the oxygen partial pressure is in the range of not lower than 10% and not higher than 30% at the time of sputtering. On the other hand, if the oxygen partial pressure is too low or too high, the contact angle is increased.

That is supposedly attributed to that both of the cases that the oxygen partial pressure is too low and too high at the time of sputtering, the oxygen content in the obtained photocatalytic films is out of a proper range or that the bonding state of the metal element and oxygen becomes instable.

Further, based on the observation, the inventors found that the photocatalytic film formed in the condition that the oxygen partial pressure was not higher than 10% was not transparent but opaque having a metallic color. It implies that since the oxygen partial pressure is too low, the oxygen content of the obtained photocatalytic film is insufficient.

On the other hand, if the oxygen partial pressure is controlled to be in a range not lower than 10% and not higher than 30% at the time of sputtering, the obtained photocatalytic film becomes transparent and excellent photocatalytic properties can be obtained. It is supposedly attributed to that the oxygen content in the photocatalytic film is in a proper range, the bonding state of the metal element and oxygen becomes stable, the life time of electron-positive hole pairs excited in the film by light radiation is prolonged and consequently the photocatalytic function is activated.

Next, the effect of the total pressure on the photocatalytic film at the time of sputtering will be described.

Figure 18:
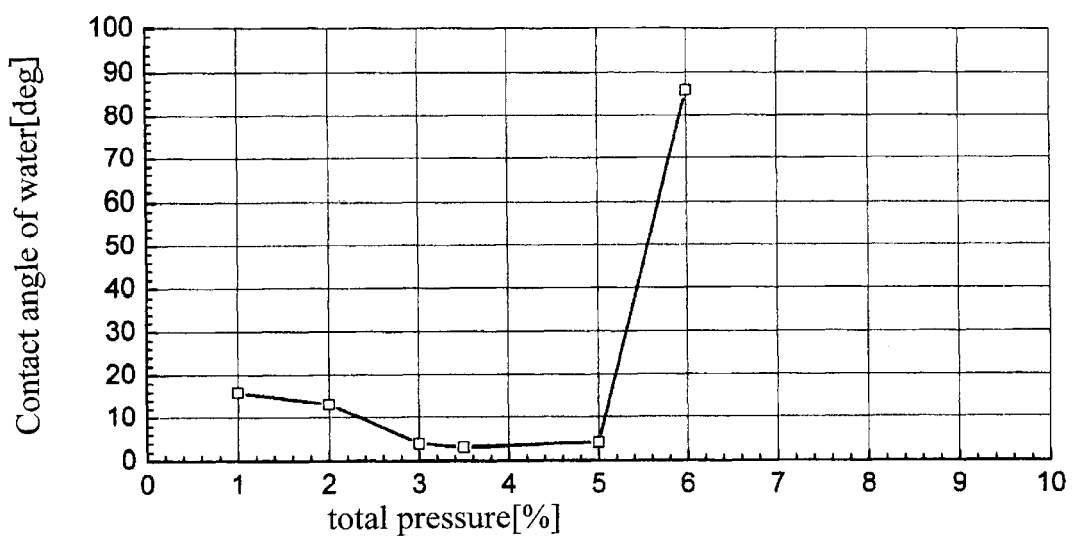
FIG. 18 is a graph showing the correlation between the total pressure at the time of sputtering and the contact angle of the obtained photocatalytic film.

FIG. 18 is a graph showing the correlation between the total pressure at the time of sputtering and the contact angle of the obtained photocatalytic film. That is, the axis of abscissa of the figure shows the total pressure at the time of the reactive sputtering and the axis of ordinate shows the contact angle of water droplet after 1-hour radiation of black light beam (radiation intensity 500 μW/cm$^2$) in the wax decomposition hydrophilization test.

All of the samples plotted in FIG. 18 were formed by deposition in the conditions of the oxygen partial pressure of 30%, the film formation speed of 0.3 nm/second to 0.6 nm/second, the temperature of 330° C., and the film thickness of 50 nm at the time of sputtering.

From FIG. 18, it can be understood that the contact angle of water droplet is about 14 degree at the total pressure 2 Pa at the time of sputtering and the contact angle is decreased to about 4 degree when the total pressure becomes 3 Pa and it implies that excellent decomposition and hydrophilization properties are obtained. It is supposedly attributed to that if the total pressure is too low, the practical oxygen supply amount is decreased and the film quality of the photocatalytic film does not become "porous" as shown in FIG. 2 or FIG. 3.

Meanwhile, in the case of the total pressure at 5 Pa, the contact angle is as low as about 4 degrees, but in the case where the total pressure is increased to 6 Pa, the contact angle is sharply increased to about 86 degrees. It is supposedly attributed to that if the total pressure is too high, the film quality of the photocatalytic film and the bonding state of the metal element and oxygen are changed.

From these results, it can be understood that excellent photocatalytic properties can be obtained by adjusting the total pressure to be in a range not lower than 3 Pa and not higher than 5 Pa at the time of sputtering.

Next, the effect of the film formation rate at the time of sputtering on the photocatalytic film will be described.

Figure 19:
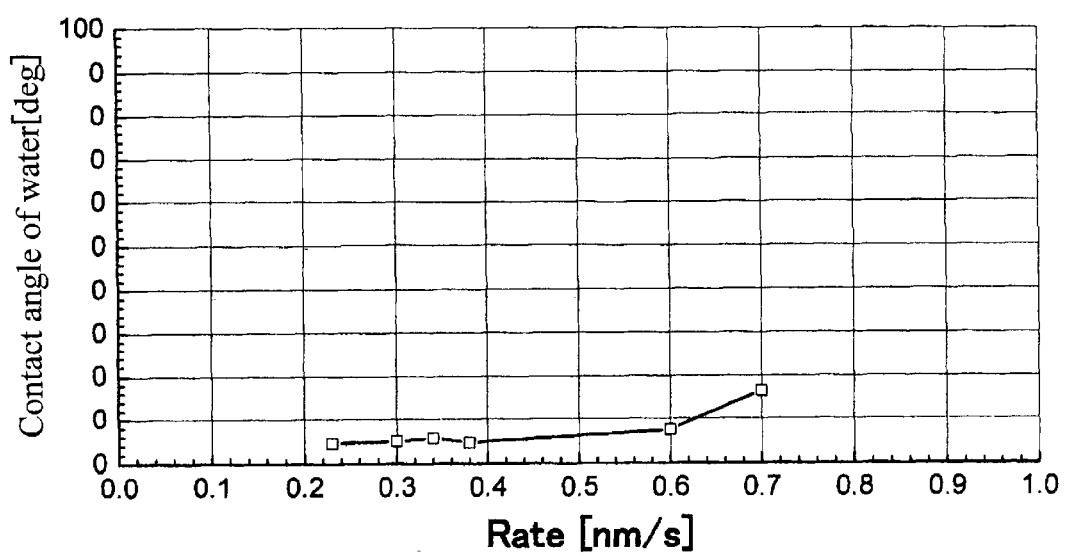
FIG. 19 is a graph showing the correlation between the film formation rate at the time of sputtering and the contact angle of the obtained photocatalytic film.

FIG. 19 is a graph showing the correlation between the film formation rate at the time of sputtering and the contact angle of the obtained photocatalytic film. That is, the axis of abscissa of the figure shows the film formation rate of the photocatalytic film at the time of the reactive sputtering and the axis of ordinate shows the contact angle of water droplet after 1-hour radiation of black light beam (radiation intensity 500 μW/cm$^2$) in the wax decomposition hydrophilization test.

The samples plotted in FIG. 19 were formed by deposition in the conditions of the oxygen partial pressure of 30%, the total pressure 3 to 5 Pa, the temperature of about 330° C., and the film thickness of 40 to 100 nm at the time of sputtering.

From FIG. 19, it can be understood that in the case where the film formation rate is in a range of 0.2 to 0.6 nm, the contact angle of water droplet is 10 degrees or lower and the excellent photocatalytic function is obtained. When the film formation rate is increased to 0.7 nm/second, the contact angle is increased to about 17 degrees. It is supposedly attributed to that if the film formation rate is too high, the film quality of the photocatalytic film and the bonding state of the metal element and oxygen are deteriorated.

From the results, it can be understood that the film formation rate is preferably at least 0.2 nm/second and at highest 0.6 nm/second.

On the other hand, the film formation rate significantly affects the "throughput" at the time of production. For example, in the case where a 50 nm-thick photocatalytic film is deposited, if the film formation rate is controlled to be 0.2 nm/s, the time taken for the film formation is 250 second, that is, exceeds 4 minutes. Meanwhile, if the film formation rate is controlled to be 0.4 nm/s, the time taken for the film formation can be shorten to be a half, that is, 125 second (about 2 minute). As described, in terms of the productivity, the film formation rate is desired to be high, as high as approximately 0.4 nm/second or higher.

Next, the effect of the temperature at the time of sputtering on the photocatalytic film will be described.

The inventors paid attention to the correlation between the "temperature" and the "film formation" rate at the time of sputtering. From data shown collectively in FIGS. 15 and 16, the following approximation inequality between the "temperature T" and the "film formation rate R" is extracted so as to obtain a "qualified" film, that is, the contact angle of water droplet after 1-hour radiation of black light beam is 10 degree or lower.

$$R \leq 2.36 \exp(-410(1/T)) \quad (1)$$

That is, if the photocatalytic film is formed by sputtering in the condition that the "temperature T" is in the range satisfying the above-mentioned inequality in relation to the film formation rate R, "qualified" photocatalytic properties can be obtained. The above-mentioned inequality (1) can be explained qualitatively as follows.

That is, at the time of reactive sputtering, the metal element sputtered from the target and oxygen molecule supplied form the ambient gas fly to be adsorbed in the deposition surface of the substrate. These elements are migrated (transferred) in the deposition surface and then bonded with each other and fixed in predetermined lattice sites. A portion of the energy needed for migration of these metal element and oxygen in the deposition surface is supplied by heating the substrate.

In the case where the film formation rate is high, since the supply speeds of the metal element and oxygen flying to the deposition surface are increased, it becomes highly possible that they are fixed at the sites in an incomplete bonding state before they are sufficiently migrated on the surface. Accordingly, it is required to fix them at stable sites in a properly bonded state by promoting the migration on the surface by increasing the substrate temperature. Therefore, in the case where the film formation rate R is high, it is desirable to increase the substrate temperature T.

In the invention, the photocatalytic film having the excellent photocatalytic function can be obtained by setting the temperature to be in a range so as to satisfy the above-mentioned inequality (1).

Next, the effect of the film thickness on the photocatalytic film will be described.

Figure 20:
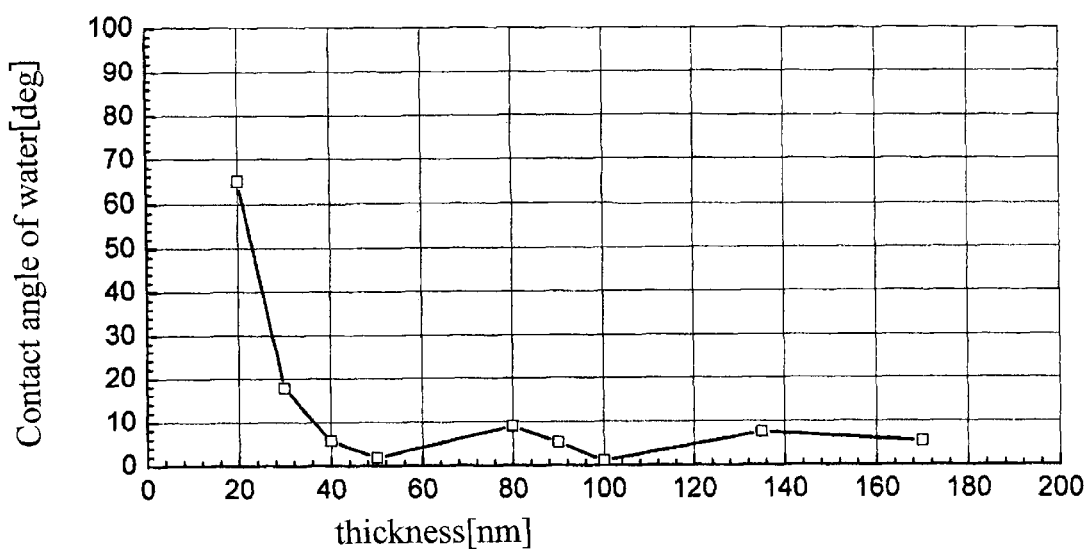
FIG. 20 is a graph showing the correlation between the film thickness of the photocatalytic film formed by sputtering and the contact angle of the obtained photocatalytic film.

FIG. 20 is a graph showing the correlation between the film thickness of the photocatalytic film formed by sputtering and the contact angle of the obtained photocatalytic film. That is, the axis of abscissa of the figure shows the film thickness of the photocatalytic film and the axis of ordinate shows the contact angle of water droplet after 1-hour radiation of black light beam (radiation intensity 500 µW/cm$^2$) in the wax decomposition hydrophilization test.

The samples plotted in FIG. 20 were deposited in the conditions of the oxygen partial pressure of 30%, the total pressure 3 to 5 Pa, the temperature of about 330° C., and the film formation rate of 0.34 to 0.4 nm/second at the time of sputtering.

From FIG. 20, in the case where the film thickness of the photocatalytic film is 20 nm, the contact angle is as very high as about 65 degrees, and in the case where the film thickness is 30 nm, the contact angle is decreased to about 18 degrees. In the case where the film thickness is increased to 40 nm, the contact angle is decreased to as low as about 6 degrees and it can be understood that the excellent photocatalytic function is obtained. On the other hand, with respect to the upper limit of the film thickness, so far to the evaluation range, the excellent photocatalytic function can be obtained until the film thickness is increased to 170 nm. In other words, the film thickness is better to be 40 nm or thicker.

The inventors carried out a wet decomposing capability test in order to investigate the relation between the film thickness and the "decomposition function" between the "decomposition function" and the "hydrophilization function" of the photocatalytic film. As an object dye to be decomposed, Methylene Blue ($C_{16}H_{18}N_3S.Cl$) is used. Methylene Blue is an organic dye which is scarcely decomposed by UV ray and irreversibly decomposed by decomposition reactivity of the photocatalyst to be colorless and therefore, it can be used for the decomposing capability evaluation of the photocatalytic film.

Figure 21:
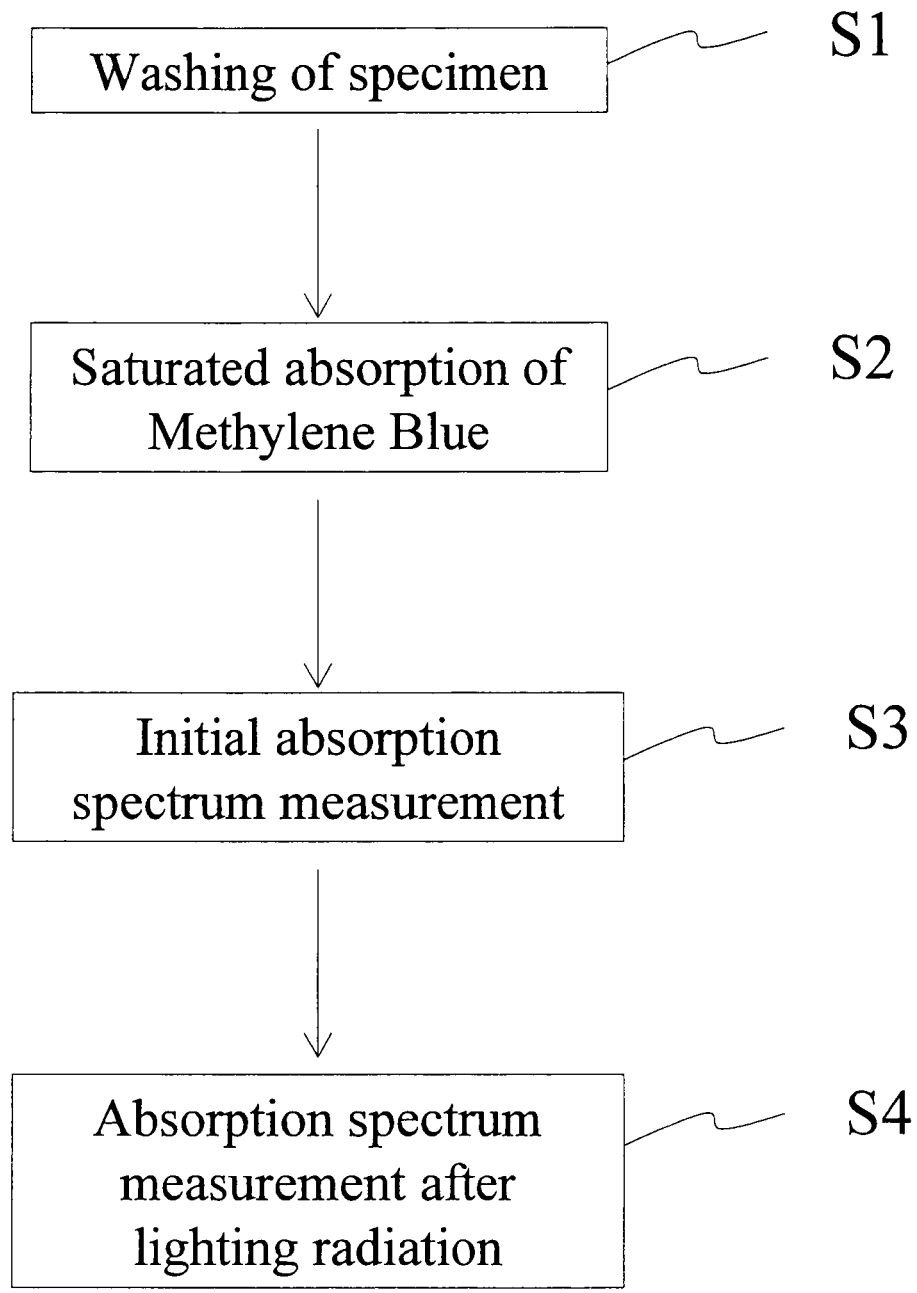
FIG. 21 is a flow chart showing the procedure of a wet type decomposition capability test.

FIG. 21 is a flow chart showing the procedure of the wet type decomposition capability test.

At first, as described in step S1, a specimen of a titanium oxide film is washed with purified water, a surfactant, and ultrasonic washing if necessary. Further, after the washing, UV ray with wavelength of 360 nm and an intensity of 1 mW/cm$^2$ or higher is radiated for 24 hours or longer to the specimen by a black light fluorescent lamp to decompose stains of organic matters remaining even after the washing by the photocatalytic function.

Next, as described in step S2, Methylene Blue is saturated and adsorbed on the surface of the specimen. That is, in order to cancel the fluctuation of the spectra owing to the adsorption of Methylene Blue on the surface of the specimen, Methylene Blue is previously adsorbed on the surface to the extent of the saturated amount. The concentration of Methylene Blue to be used in form of an adsorption solution is adjusted to be 0.02 mmol/l. A new adsorption solution is brought into contact with the specimen for 12 hours and the adsorption process is repeated until the absorbance of the adsorption solution is not decreased.

On completion of the saturated adsorption of Methylene Blue on the surface of the specimen in such a manner, as described in step S3, an initial absorption spectrum is measured. In this case, the concentration of the Methylene Blue test solution is adjusted to be 0.01 mmol/l.

Next, in step S4, the spectrum after light radiation is measured. That is, while being put in a cell, the Methylene Blue test solution is brought into contact with the surface of the specimen and in such a situation, UV ray with 1 mW/cm$^2$ is radiated for 20 minutes. Immediately after the light radiation, the absorption spectrum of the Methylene Blue test solution is measured. Then the measured test solution is quickly turned back to the cell and while being brought into contact with the specimen, the solution is subjected to UV radiation again for 20 minutes.

In such a manner, the absorption spectrum of the Methylene Blue test solution is measured after the UV radiation for at every 20 minutes and the measurement is carried out 9 times for radiation duration in total 3 hours. Methylene Blue is more quickly decomposed and decolored as the decomposition capability of the photocatalytic film is higher. Consequently, the absorption property is decreased.

Figure 22:
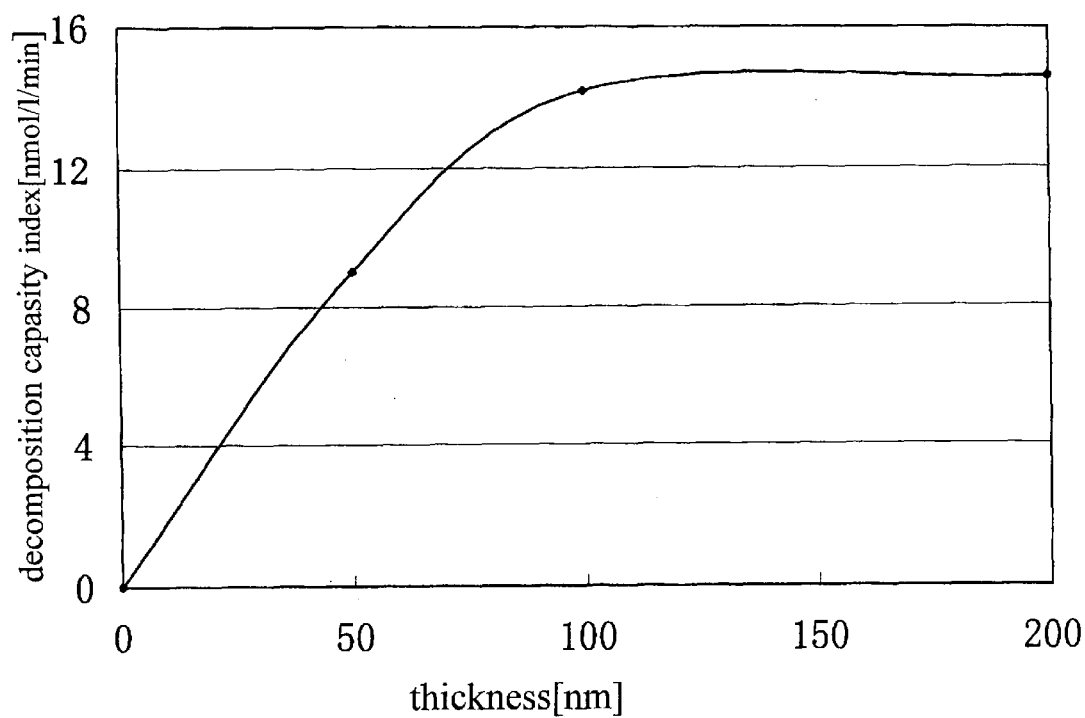
FIG. 22 is a graph exemplifying the results of the wet type decomposition capability test.

FIG. 22 is a graph exemplifying the results of the wet type decomposition capability test. That is, in the figure, the axis of abscissa shows the film thickness of the photocatalytic film and the axis of ordinate shows the decomposition capability index (nmol/l/min) calculated on the basis of absorbance.

As it can be understood from the figure, the decomposition capability index of the photocatalytic film is increased as the film thickness is increased and when the film thickness reaches 100 nm, the index is approximately saturated. That is, in terms of the "decomposition function", the decomposition property of the photocatalytic film obtained by the sputtering method is found approximately saturated in the case where the film thickness is in a range of 100 nm or thicker.

In the wax decomposition hydrophilization test shown in FIG. 20, based on the fact that the excellent photocatalytic function is obtained even in the case where the film thickness is in a range of 100 nm or thinner, in this film thickness range, it can be assumed that the "hydrophilization property" of the photocatalytic film is functioning.

Further, based on the observation of the inventors, if the film thickness of the photocatalytic film exceeds approximately 80 nm, double images owing to light reflection are observed in some cases by eye observation. Accordingly, from that viewpoint, the film thickness of the photocatalytic film is desirably adjusted to be in a range of not thinner than 40 nm and not thicker than 80 nm. Also, from the viewpoint of throughput, the film thickness of the photocatalytic film is desirably made thin.

Next, the function of a "buffer layer" to be formed in the substrate and the photocatalytic film will be described.

Figure 23:
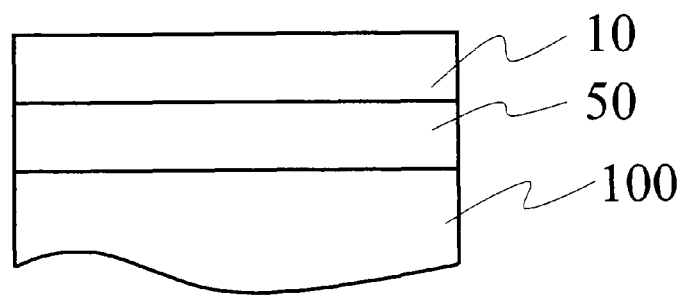
FIG. 23 is a schematic view exemplifying the cross-sectional structure of a photocatalyst having a buffer layer provided thereon.

FIG. 23 is a schematic view exemplifying the cross-sectional structure of a photocatalyst having a buffer layer.

That is, a buffer layer 50 is formed on a predetermined substrate 100 and a photocatalytic film 10 is formed thereon. As a material for the buffer layer 50, for example, silicon oxide can be employed.

Formation of such a buffer layer 50 can prevent impurity contamination from the substrate 100 to the photocatalytic film 10. Further, the formation can improve the surface state of the substrate 100 and makes the initial stage of the deposition of the photocatalytic film 10 controllable.

For example, in the case where soda-lime glass is used as the substrate 100, if the alkali element such as sodium (Na) contained in the glass is diffused in the photocatalytic film 10, the photocatalytic properties are sometimes deteriorated. In such a case, the impurity diffusion can be prevented and the deterioration of the photocatalytic properties can be prevented by forming the buffer layer 50 of silicon oxide or the like.

Also, in the case where the surface of the substrate 100 has uneven surface in micro order, the surface unevenness can be moderated and the initial stage of the deposition of the photocatalytic film 10 can be made closer to the ideal state by forming the buffer layer 50 in a proper thickness.

The inventors investigated the effect of the buffer layer 50 by using soda-lime glass as the substrate 100, silicon oxide as the buffer layer 50, and titanium oxide as the photocatalytic film 10.

Figure 24:
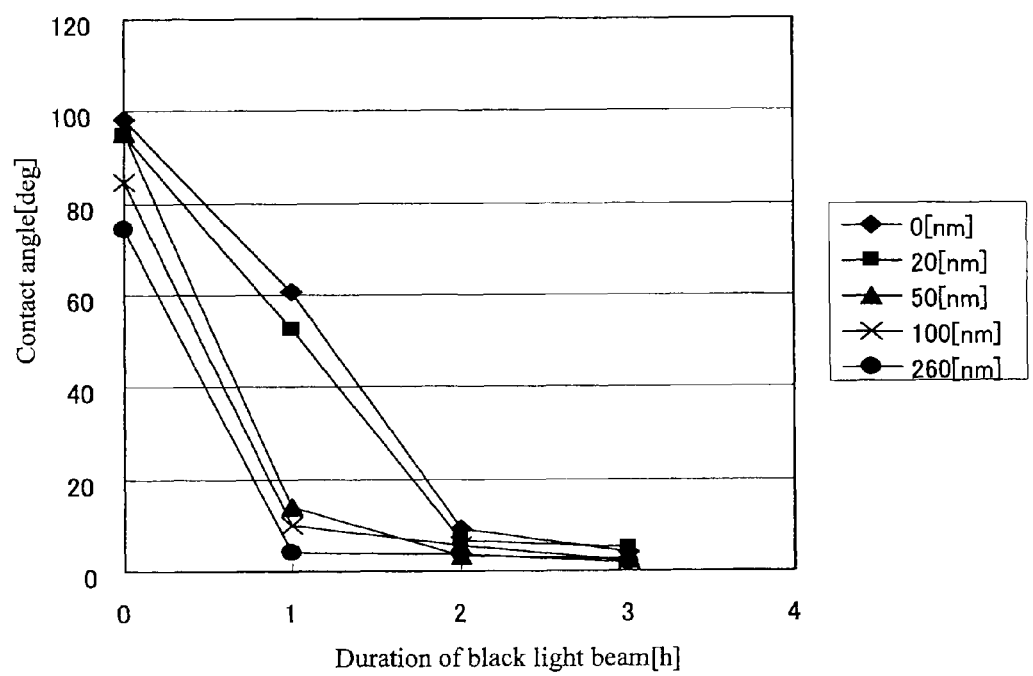
FIG. 24 is a graph showing the results of the wax decomposition and hydrophilization test.

FIG. 24 is a graph showing the results of the wax decomposition and hydrophilization test. That is, the axis of abscissa of the figure shows the radiation duration of black light beam (radiation intensity 500 $\mu W/cm^2$) and the axis of ordinate shows the contact angle of water droplet.

In the figure, the results of photocatalysts in which the thickness of the buffer layer 50 is adjusted to be 0 nm, 20 nm, 50 nm, 100 nm, and 260 nm are shown. Incidentally, with respect to all of the samples, the deposition of the photocatalytic film 10 was carried out by reactive sputtering and the conditions were adjusted as follows: the oxygen partial pressure of 30%, the total pressure of 5 Pa, the temperature about of 330° C., the film formation speed of 0.5 nm/second, and the film thickness of 50 nm.

From FIG. 24, it is found that in one hand, the contact angle of water droplet is 50 degrees or higher after 1-hour radiation of black light beam in the case where the film thickness of the buffer layer 50 is in a range from zero to 20 nm, on the other hand, the contact angle of water droplet is decreased to about 14 degrees after 1-hour radiation in the case where the film thickness of the buffer layer 50 is 50 nm. Further, in the case where the film thickness of the buffer layer 50 is 100 nm, the contact angle of water droplet is decreased to about 10 degrees after 1-hour radiation, and in the case where the film thickness of the buffer layer 50 is 260 nm, the contact angle of water droplet is decreased to about 4 degrees after 1-hour radiation.

As described, if the buffer layer 50 having a proper thickness is formed, the photocatalytic properties are found improved.

Second Embodiment

Next, as a second embodiment of the present invention, a photocatalyst in which a coating layer of silicon oxide is formed on a photocatalytic film of titanium oxide or the like having a photocatalytic function will be described.

Figure 25:
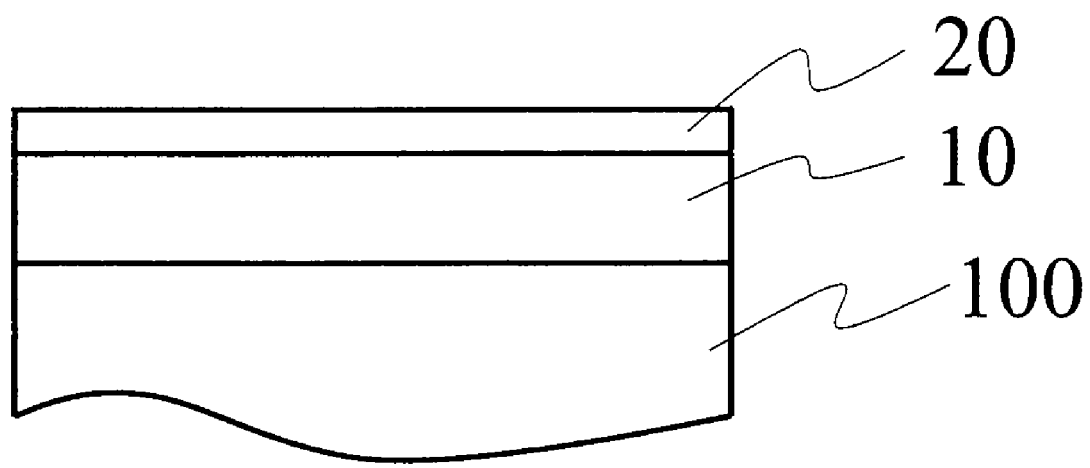
FIG. 25 is a schematic view showing the cross-sectional structure of a photocatalyst according to a second embodiment of the invention.

FIG. 25 is a schematic view showing the cross-sectional structure of the photocatalyst of this embodiment.

That is, the photocatalyst of the embodiment has a structure having a photocatalytic film 10 provided on a substrate 100 and a coating layer 20 having further formed thereon. Here, the photocatalytic film 10 is a porous layer similar to the photocatalytic film 10 of titanium oxide or the like described with reference to FIGS. 1 to 24. Further, as the coating layer 20, for example, oxides such as silicon oxide can be employed.

The coating layer 20 properly protects the surface of the photocatalytic film 10 to the extent that photocatalytic function is not interfered and at the same time has a function of keeping hydrophilicity. That is, in the state that light is radiated, as described with reference to FIGS. 1 to 24, the porous photocatalytic film 10 exhibits the active photocatalytic function and decomposes adhering substances to keep high hydrophilicity. However, in the state that no light is radiated, no photocatalytic function of the photocatalytic film 10 is obtained. Meanwhile, the coating layer 20 keeps the hydrophilicity, and therefore, an effect of preventing fixation of pollutants on the surface can be maintained.

Accordingly, if the thickness of the coating layer 20 is too thick, the layer causes interference to the photocatalytic function of the photocatalytic film 10 and on the other hand, if the coating layer 20 is too thin, the hydrophilicity becomes insufficient.

Figure 26:
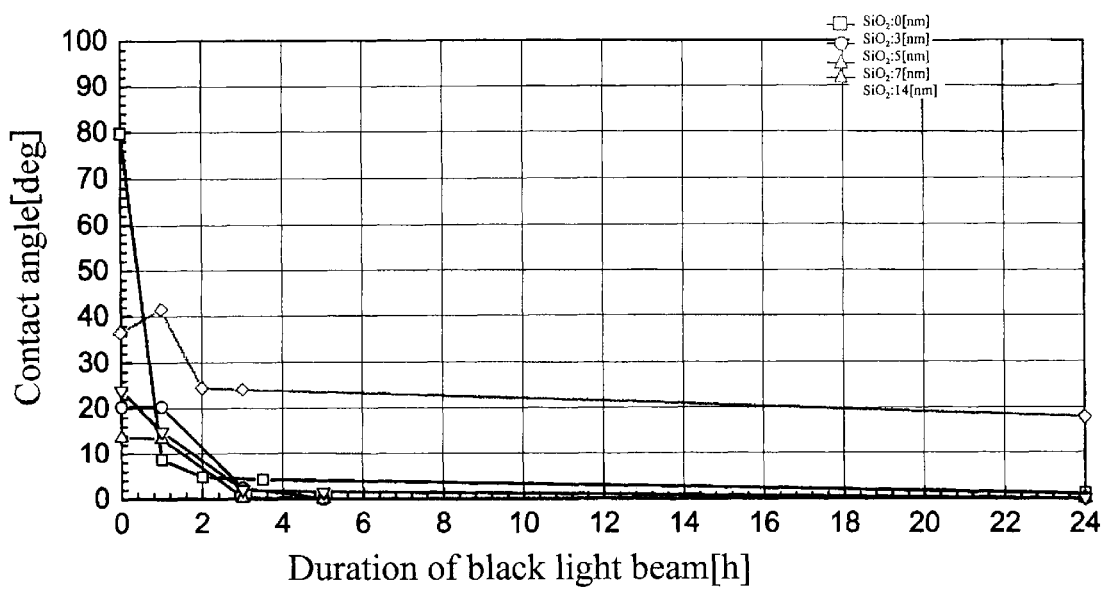
FIG. 26 is a graph exemplifying the results of a wax decomposition and hydrophilization test of a photocatalytic film having a layered structure of FIG. 25.

FIG. 26 is a graph exemplifying the results of a wax decomposition and hydrophilization test of the photocatalytic film having a layered structure shown in FIG. 25. As the substrate 100, soda-lime glass was used. As the photocatalytic film 10, a titanium oxide film produced in the same conditions as those for the above-mentioned sample D in the first embodiment was used. Meanwhile, as the coating layer 20 to be deposited thereon, silicon oxide was used. The deposition of the coating layer 20 was carried out continuously from the deposition of the photocatalytic film 10 by reactive sputtering by using a gas mixture of argon (Ar) and oxygen ($O_2$). The DC loaded electric power was 300 W: the total pressure was 3.5 Pa: and the oxygen partial pressure was 30%.

FIG. 26 shows plotted data of 5 kinds of samples having the coating layers 20 with the thickness of 0 nm, 3 nm, 5 nm, 7 nm, and 14 nm, respectively. From the figure, it can be understood that the contact angle in the initial state before black light beam radiation is decreased in all of Samples having the coating layers 20 as compared with that in the sample having no coating layer 20. It means that the coating layer 20 improves the hydrophilicity of the surface.

On the other hand, on the basis of the contact angle after the black light beam radiation, in the case where the thickness of the coating layer 20 is 3 nm to 7 nm, the wax decomposition property approximately same as that of a sample having no coating layer (the sample with 0 nm thickness of $SiO_2$) is observed, and therefore, it can be understood that the photocatalytic function is scarcely interfered. Incidentally, the radiation intensity of the black light beam employed here is 50 $\mu m/cm^2$. Considering that the intensity is lower than that employed commonly in the case of carrying out the wax decomposition hydrophilization test as described above, it can be said that the coating layer with the thickness in the above-mentioned range does not practically interfere the photocatalytic function.

However, if the thickness of the silicon oxide layer 20 becomes 14 nm, the decreasing degree of the contact angle becomes small and it means the photocatalytic function is interfered.

In other words, from the results shown in FIG. 26, the thickness of the coating layer 20 is preferable not thinner than 3 nm and not thicker than 7 nm.

Figure 27:
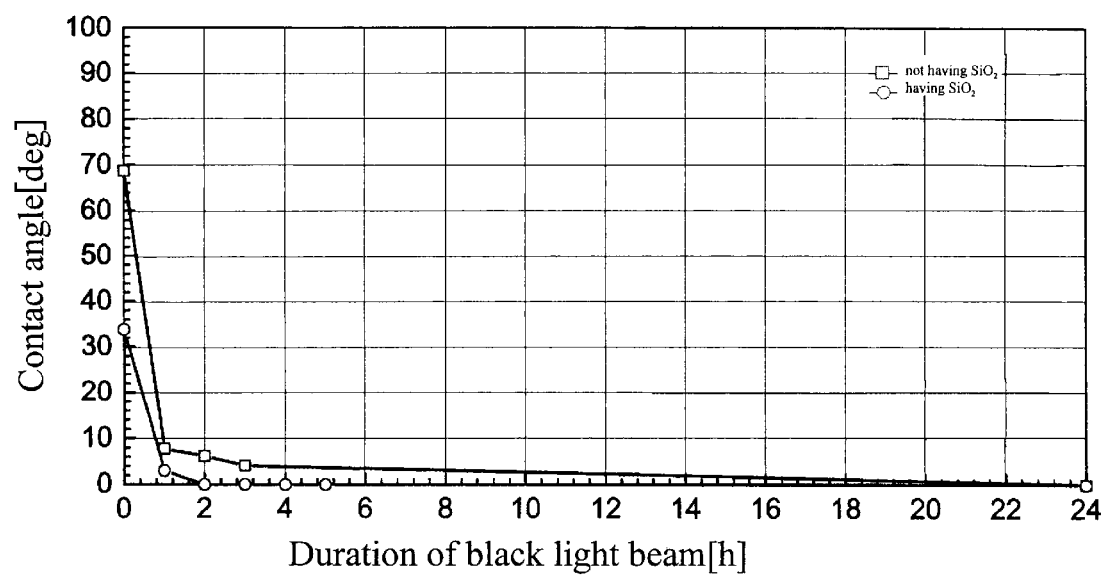
FIG. 27 is a graph exemplifying the results of the wax decomposition and hydrophilization test of the photocatalytic film according to the second embodiment of the invention.
Figure 28:
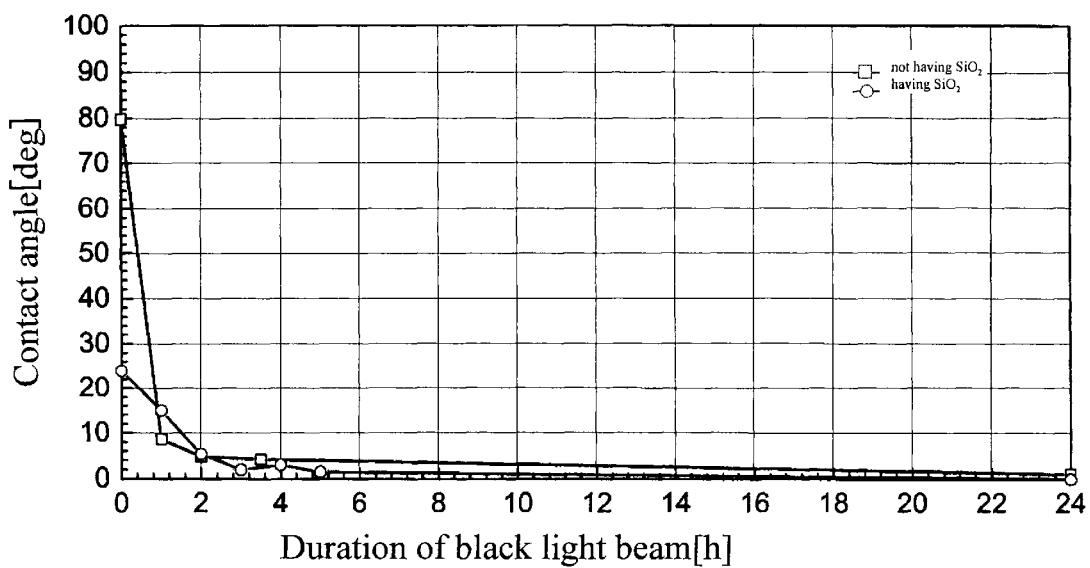
FIG. 28 is a graph exemplifying the results of the wax decomposition and hydrophilization test of the photocatalytic film according to the second embodiment of the invention.
Figure 29:
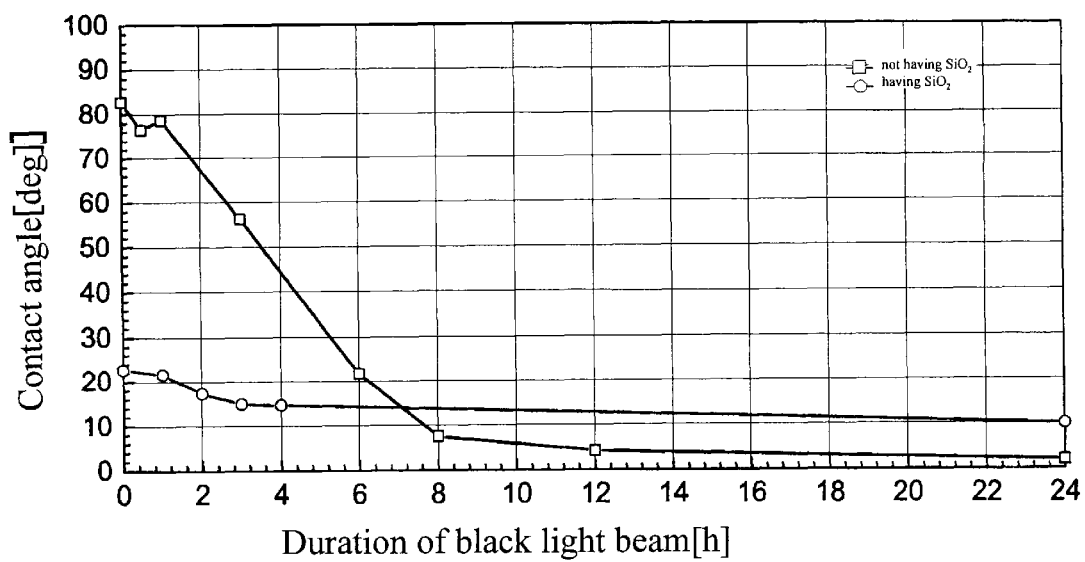
FIG. 29 is a graph exemplifying the results of the wax decomposition and hydrophilization test of the photocatalytic film according to the second embodiment of the invention.

FIGS. 27 to 29 are graphs exemplifying the results of the wax decomposition and hydrophilization test of the photocatalytic film of the embodiment. With respect to the photocatalytic film employed here, a titanium oxide film same as Sample D described in the first embodiment was used as the photocatalytic film 10 and a silicon oxide film with a thickness of 7 nm was used a the coating layer 20.

As Comparative example, data of a sample having no coating layer 20 is also shown.

FIG. 27 shows data obtained in the case where the radiation intensity of black light beam is 500 μm/cm². With this radiation intensity, the photocatalytic film of the embodiment having the coating layer 20 is found having better hydrophilicity before and after the radiation.

FIG. 28 shows data obtained in the case where the radiation intensity of black light beam is as slight as 50 μm/cm². With this radiation intensity, the photocatalytic film of the embodiment is found having better hydrophilicity before the radiation and approximately same hydrophilicity as that of Comparative example after the radiation.

On the other hand, FIG. 29 shows data obtained in the case where the radiation intensity of black light beam is as extremely slight as 10 μm/cm². With this radiation intensity, the photocatalytic film of the embodiment is found having better hydrophilicity after 7 hours from the radiation. It is supposedly attributed to that the hydrophilicity of the coating layer 20 is dominant to the photocatalytic function of the photocatalytic film 10 in the ultra slight light radiation.

As described above, according to the embodiment, excellent hydrophilicity can be maintained before the light radiation or in the case where the light intensity is slight.

Figure 30:
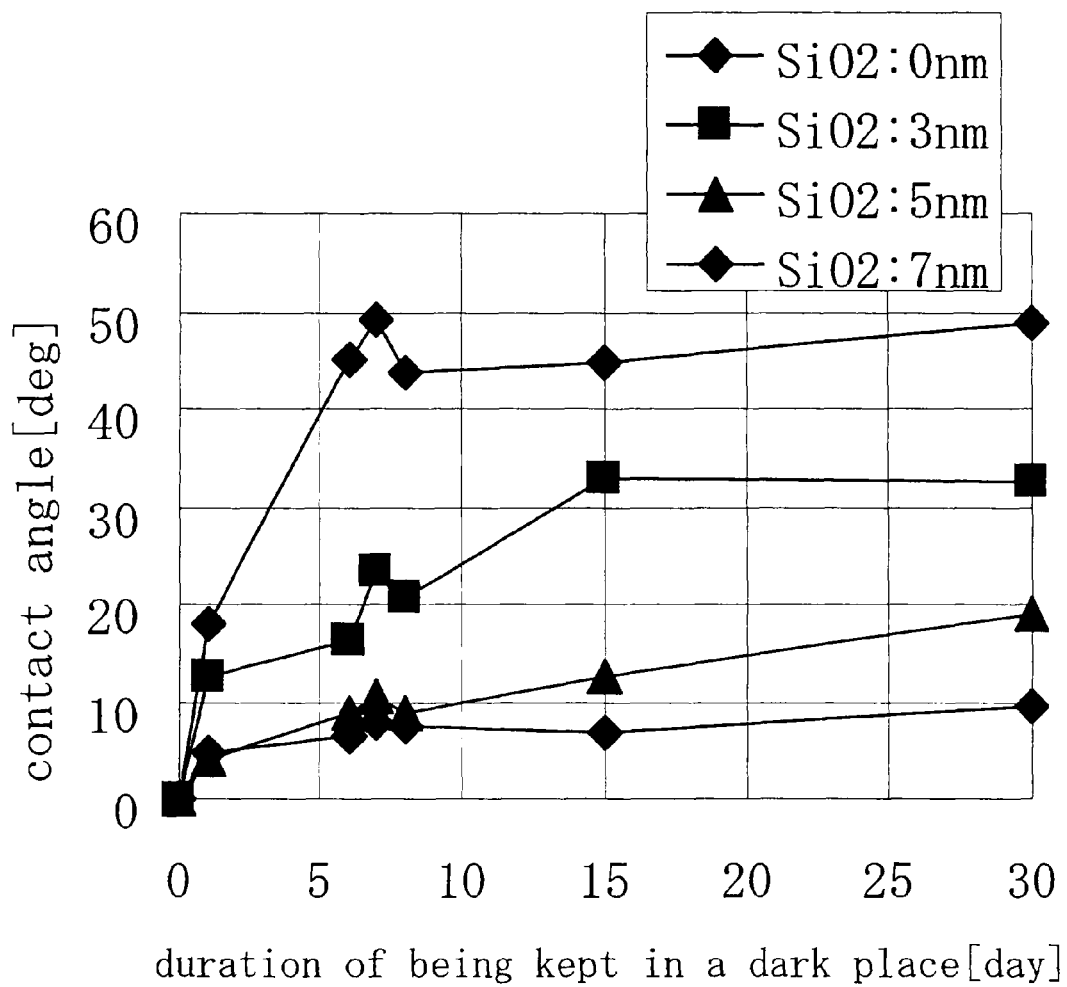
FIG. 30 is a graph showing alteration of a contact angle of the photocatalytic film of the second embodiment of the invention in the case wherein the film is kept in a dark place.

FIG. 30 is a graph showing the alteration of the contact angle of the photocatalytic film of the embodiment in the case where the photocatalytic film is kept in a dark place.

That is, in this case, the figure shows the results of the measurement of the alteration of the contact angle of the photocatalytic film kept from the light and placed in a dark place after the contact angle is decreased to approximately zero by radiating black light beam.

From the results shown in the figure, in the case where no coating layer 20 is formed, the contact angle is increased in a relatively short time by shutting out the light and is increased to about 45 degrees after 8 days. On the other hand, in the case of samples of the embodiment having the coating layers 20, the increase of the contact angle is moderate and it is found that as the thickness of the coating layers 20 becomes thicker, the increase is suppressed more. In other words, it is confirmed that as the thickness of the coating layers 20 becomes thicker, the photocatalytic film is more excellent in the hydrophilicity retention property in a dark place.

As described above, according to the embodiment, formation of the coating layer 20 with a thickness in a predetermined range on the photocatalytic film 10 of titanium oxide or the like provides the excellent retention property in a dark place without causing practical interference to the photocatalytic function. As a result, both in the case of radiating light and in the case of shutting light or radiating only extremely slight light, hydrophilicity of the surface can be kept high.

Herein after, the embodiments of the invention will be described more in details with reference to Examples.

Example 1

At first, as Example 1 of the invention, a photocatalyst of the first embodiment of the invention was produced and compared with Comparative example produced by a conventional method.

Figure 31:
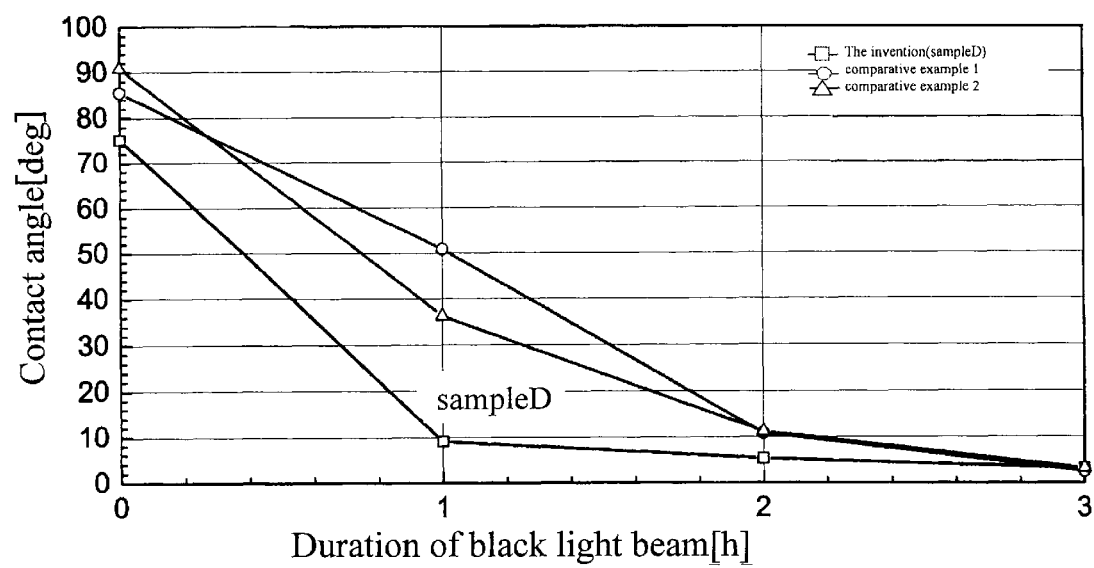
FIG. 31 is a graph showing the photocatalytic functions of the photocatalysts of the invention and Comparative example.

FIG. 31 is a graph showing the photocatalytic functions of the photocatalysts of the invention and the Comparative example. That is, this figure shows the results of the wax decomposition hydrophilization test and in this case, the radiation intensity of black light beam was adjusted to be 500 μm/cm².

The photocatalyst of this example of the invention was the same as Sample D described as the photocatalytic film of the first embodiment of the invention. Comparative examples 1 and 2 were also produced by a reactive sputtering method and their properties were also plotted together.

The film formation conditions for the respective cases are collectively shown as follows

|  | Sample D | Comparative example 1 | Comparative example 2 |
|---|---|---|---|
| Film formation method | DC sputtering | RF sputtering | RF sputtering |
| Loaded electric power | 3 kW | 220 W | 220 W |
| Deposition rate | 36 nm/min | 3.5 nm/min | 3.5 nm/min |
| Total pressure | 5 Pa | 2.7 Pa | 2.7 Pa |
| Oxygen partial pressure | 30% | 11% | 50% |
| Substrate temperature | 280° C. or lower | 300° C. | 400° C. |

Since the above-mentioned sample D was subjected to heating and degassing in a preliminary chamber before the deposition by sputtering, the initial temperature at the time of deposition was higher than a room temperature. However, the deposition was carried out in the condition that the highest level of the temperature did not exceed 280° C. during the deposition. Further, in all of the samples, the background pressure in the vacuum chamber was decreased by evacuation to $8 \times 10^{-4}$ Pa or lower before the film formation.

From the results shown in FIG. 31, the contact angle before the black light beam radiation was 75 degrees for the invention (Sample D), 85 degrees for Comparative example 1, and 90 degrees for Comparative example 2. When black light beam was radiated, the contact angle was sharply decreased in the photocatalytic film of the invention and decreased to about 9 degrees after 1 hour. Meanwhile, the decreasing speed of Comparative examples 1 and 2 was moderate and the contact angles of Comparative examples 1 and 2 were decreased only to 36 degree and 51 degree, respectively. As described, the photocatalytic film of the invention was confirmed to have a remarkable photocatalytic function as compared with the photocatalytic films of Comparative examples.

The surfaces of these Comparative examples 1 and 2 had structures in which the particles 10 times as large as those shown in FIGS. 6(*a*) and 7(*a*) were densely agglomerated and thus they were not porous.

Next, these samples were subjected to the measurement of the x-ray diffraction pattern.

Figure 32:
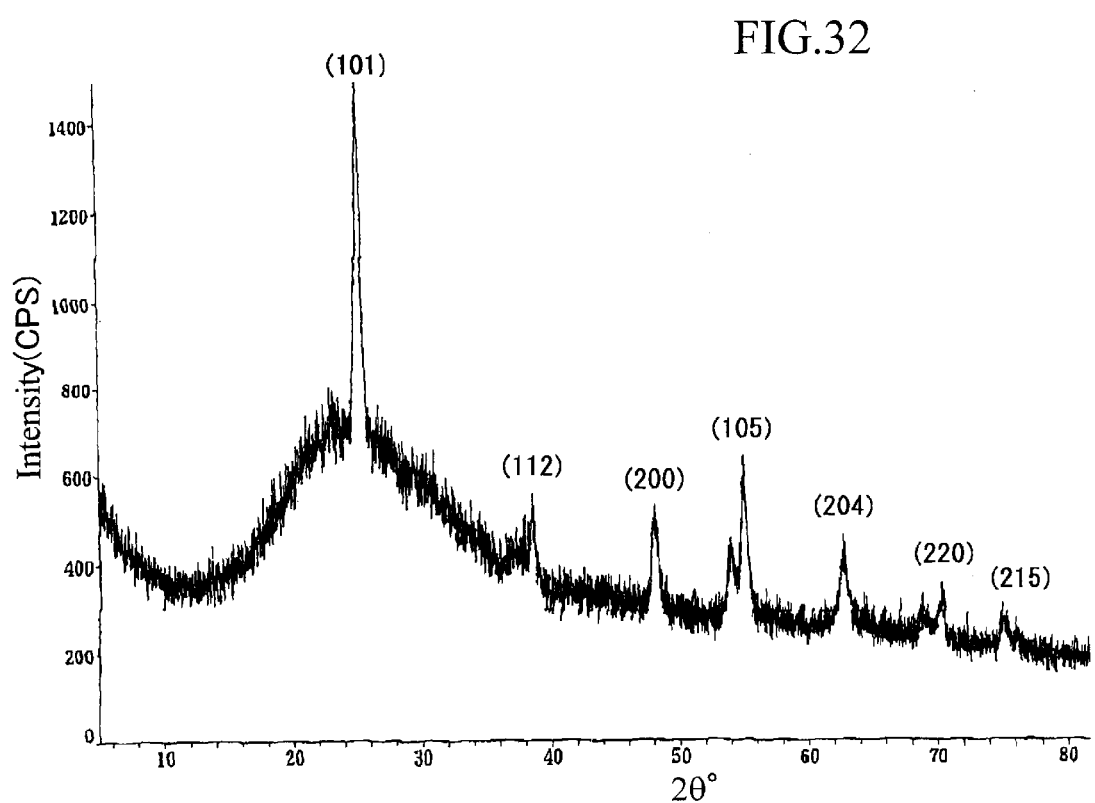
FIG. 32 is a graph showing an x-ray diffraction pattern of Sample D.

FIG. 32 is a graph showing the x-ray diffraction pattern of Sample D.

Figure 33:
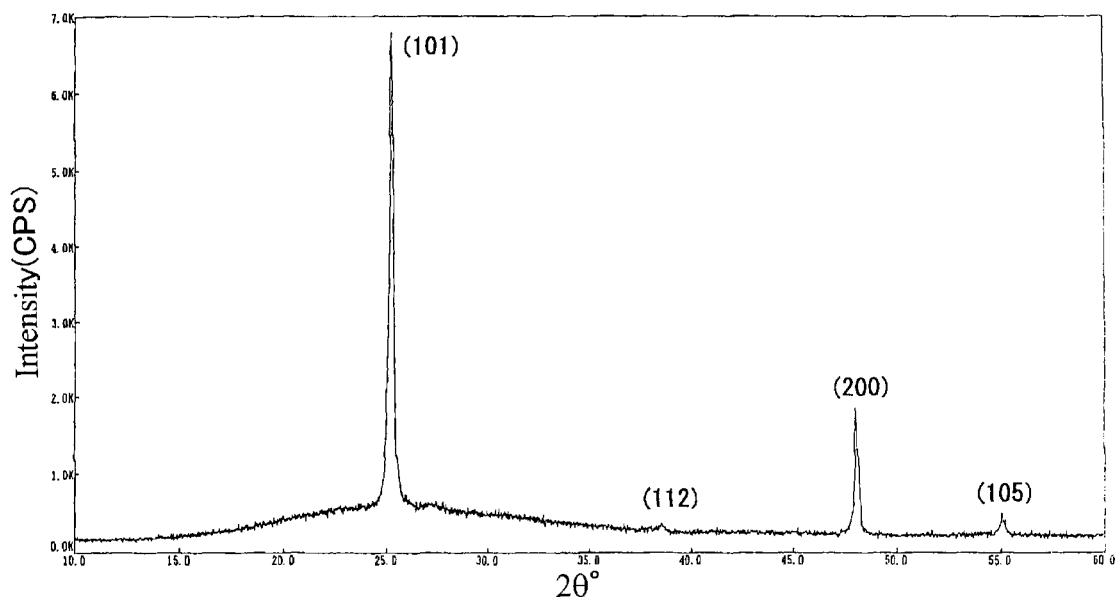
FIG. 33 is a graph showing an x-ray diffraction pattern of Comparative example 1.

Also, FIG. 33 is a graph showing the x-ray diffraction pattern of Comparative example 1.

The diffraction peaks appearing in these Figs. corresponded to the diffraction peaks of $TiO_2$ with "anatase structure".

In comparison of FIG. 32 (Sample D) and FIG. 33 (Comparative example 1), it was found that the intensity of the diffraction peaks relative to the background level and the balance among peaks were significantly different although the measurement was carried out in the same conditions. That is, in Comparative example 1 (FIG. 33), the intensity values of the diffraction peaks were extremely high to the background level and sharp and outstanding diffraction peaks appeared. Moreover, other than the diffraction peaks at lower order (101) and (200), the diffraction peaks scarcely appeared.

On the contrary, in Sample D of the invention (FIG. 32), the intensity levels of the diffraction peaks relative to the background level were low as a whole and slight and broad diffraction peaks were obtained. Moreover, a large number of higher order diffraction peaks appeared.

Based on the investigation of the intensity balance of other diffraction peaks to the anatase-derived (101) diffraction peak, in the case of Comparative example 1 (FIG. 32), the intensity levels of (101) and (200) diffraction peaks were overwhelmingly high, and accordingly it can be understood that a structure strongly oriented in these lower level plane directions was obtained On the other hand, in the case of Sample D of the invention (FIG. 32), the intensity balance of the (101) diffraction peak was rather low and a large number of higher level diffraction peaks were observed. That is, in Sample D of the invention, the orientation degree was low and it is supposed that a large number of fine crystal particles with disordered plane orientation were gathered together.

The intensity ratio of the (101) diffraction peak to other main diffraction peaks are collectively shown as follows.

| Intensity ratio of diffraction peak | Sample D | Comparative example 1 |
| --- | --- | --- |
| (101)/(112) | 3.7 | >1,000 |
| (101)/(105) | 6.3 | approximately 270 |

From the above intensity ratios, it can be understood that in the case of the Comparative example 1, the intensity ratio of the (101) diffraction peak was overwhelmingly high and a strongly oriented thin film structure was obtained. In comparison therewith, with respect to Sample D, it can quantitatively be understood that the intensity ratio of the (101) diffraction peak was extremely low.

In other words, from these results, it is found that the photocatalytic film of Comparative example 1 had rather good crystallinity, meanwhile Sample D of the invention was porous, had a large number of crystal defects, and comprised agglomerates of fine particles.

In comparison of the film formation conditions of the invention to those of Comparative example, the deposition ratio of the invention was at least 10 times high and the total pressure was also high and the substrate temperature was low. In other words, in these Comparative examples, the film formation was carried out at higher temperatures, the lower pressure, and the lower rate. In general, in the case of depositing a thin film at a high temperature and a low rate, the crystalline tends to be good and the film quality tends to be dense. They are coincident with the results of the surface structure and the x-ray diffraction.

On the contrary, in the invention, the deposition rate was considerably quickened as compared with that of a conventional case and film formation was carried out at a higher pressure and a lower temperature, so that the photocatalytic film was made to be particularly porous and the photocatalytic function was remarkably improved.

Example 2

Next, as Example 2 of the invention, the photocatalyst of the second embodiment of the invention and a conventional photocatalyst were compared with each other and investigated on the photocatalytic function under slight light radiation.

At first, as the photocatalyst of the invention, the same one shown in FIG. 25 was produced. Here, soda-lime glass was used as the substrate 100 and a 50 μm-thick buffer layer of silicon oxide was deposited thereon and a photocatalytic film 10 and a coating layer 20 were continuously deposited further thereon.

With respect to the photocatalytic film 10, the same one as the above-mentioned sample B in the first embodiment was deposited. As the coating layer 20, a 7 nm-thick silicon oxide was deposited by reactive sputtering.

On the other hand, as Comparative example 3, a 100 nm-thick titanium oxide film was deposited on the same substrate by vacuum evaporation and buffer layer by vacuum evaporation and a 15 nm-thick silicon oxide film was deposited further thereon by vacuum evaporation. At the time of the titanium oxide deposition, $Ti_2O_3$ was used as a evaporation source, and while oxygen was introduced into the vacuum chamber so as to keep the oxygen partial pressure of $1.3 \times 10^{-2}$ Pa, electron beam evaporation was carried out. The titanium oxide deposition rate was 18 nm/min and the substrate temperature was 200° C.

At the time of silicon oxide deposition, $SiO_2$ was used as the evaporation source and while oxygen was introduced into the vacuum chamber so as to keep the oxygen partial pressure of $2.6 \times 10^{-2}$ Pa, electron beam evaporation was carried out. The titanium oxide deposition rate was 30 nm/min and the substrate temperature was 200° C.

Figure 34:
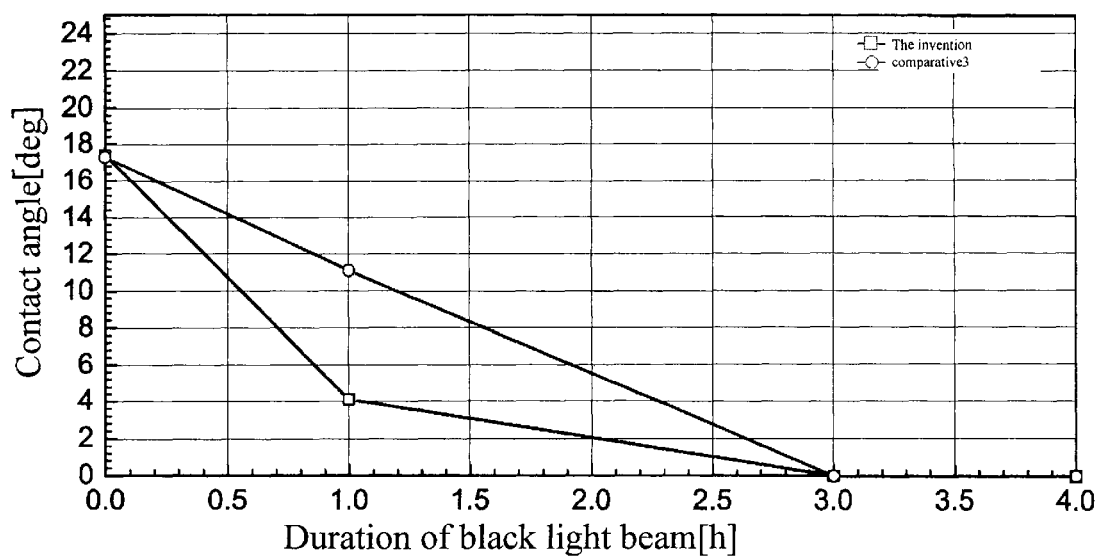
FIG. 34 is a graph for comparison of the photocatalytic functions of the photocatalysts of the invention and comparative examples.

FIG. 34 is a graph for comparison of the photocatalytic functions of the photocatalysts of the invention and Comparative example. That is, the figure shows the results of the wax decomposition hydrophilization test and the radiation intensity of the black light beam was made to be as slight as 50 μm/cm².

It can be understood from FIG. 34 that the contact angles of the initial state of both of the invention and Comparative example are same, about 17.4 degrees, the decreasing rates differ after radiation of black light beam. The photocatalyst of the invention showed the contact angle decreased to about 4 degrees after 1-hour radiation, meanwhile the photocatalyst of Comparative example showed the contact angle decreased only to about 11 degrees.

Accordingly, the photocatalyst of the invention was found having a high photocatalytic function as compared with the photocatalyst having a conventional layered structure even under light radiation as slight as 50 μm/cm². It is supposedly attributed to that the photocatalytic film 10 was excellent in the photocatalytic function in combination with that the film thickness of the coating layer 20 was set in a proper range.

Example 3

Next, as Example 3 of the invention, the photocatalyst of the second embodiment and a conventional photocatalyst were compared with each other and investigated on the photocatalytic functions under ultra slight light radiation.

Also in this example, as the photocatalyst of the invention, the same one shown in FIG. 25 was produced. That is, soda-lime glass was used as the substrate 100 and a 50 μm-thick buffer layer of silicon oxide was deposited thereon and a photocatalytic film 10 and a coating layer 20 were continuously deposited further thereon.

With respect to the photocatalytic film 10, the same one as the above-mentioned sample D in the first embodiment was deposited. As the coating layer 20, a 7 nm-thick silicon oxide was deposited by reactive sputtering.

On the other hand, as Comparative example 3, the same sample as described above in Example 2 was produced.

Figure 35:
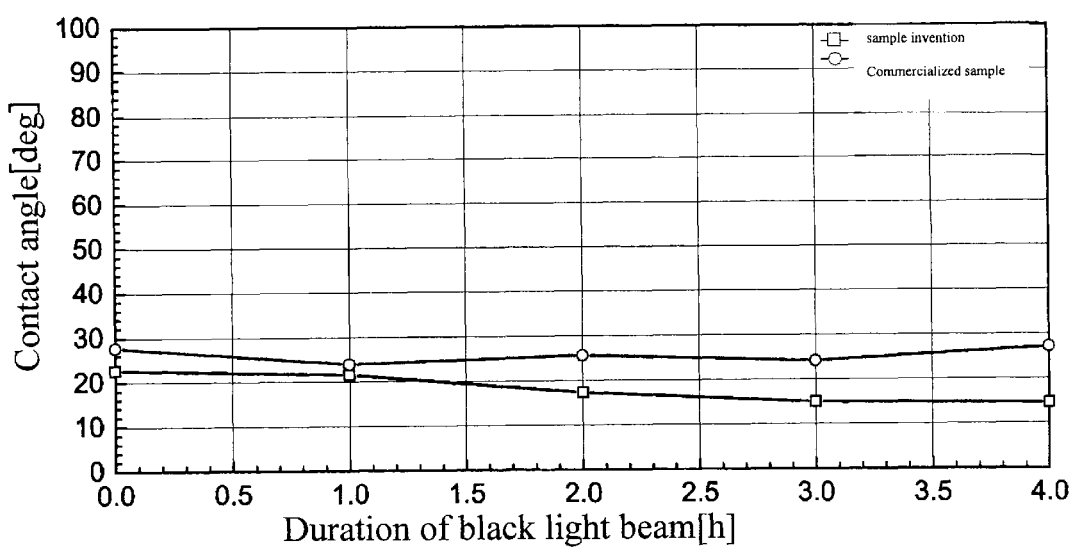
FIG. 35 is a graph for comparison of the photocatalytic functions of the photocatalysts of the invention and comparative Example.

FIG. 35 is a graph for comparison of the photocatalytic functions of the photocatalysts of the invention and Comparative example. That is, the figure shows the results of the wax decomposition hydrophilization test and the radiation intensity of the black light beam was made to be as ultra slight of 10 μm/cm².

It can be understood from FIG. 35 that the contact angle was scarcely decreased and slightly fluctuated even if black light beam was radiated in the sample of Comparative example 3. It means the photocatalytic function was scarcely caused by the black light beam radiation as ultra slight of 10 μm/cm².

On the other hand, the contact angle of the photocatalyst of the invention was reliably decreased by black light beam radiation even though the decrease was slight and it was found the photocatalytic function was caused.

Accordingly, the photocatalyst of the invention was found having a high photocatalytic function even under light radiation as ultra slight of 10 μm/cm² and as compared with that of a photocatalyst having a conventional layered structure, the photocatalytic function was active. It is also supposedly attributed to that the photocatalytic film 10 was excellent in the photocatalytic function in combination with that the film thickness of the coating layer 20 was set in a proper range.

Example 4

Next, as Example 4 of the invention, a production apparatus preferable to be used for producing a photocatalyst of the invention will be described.

Figure 36:
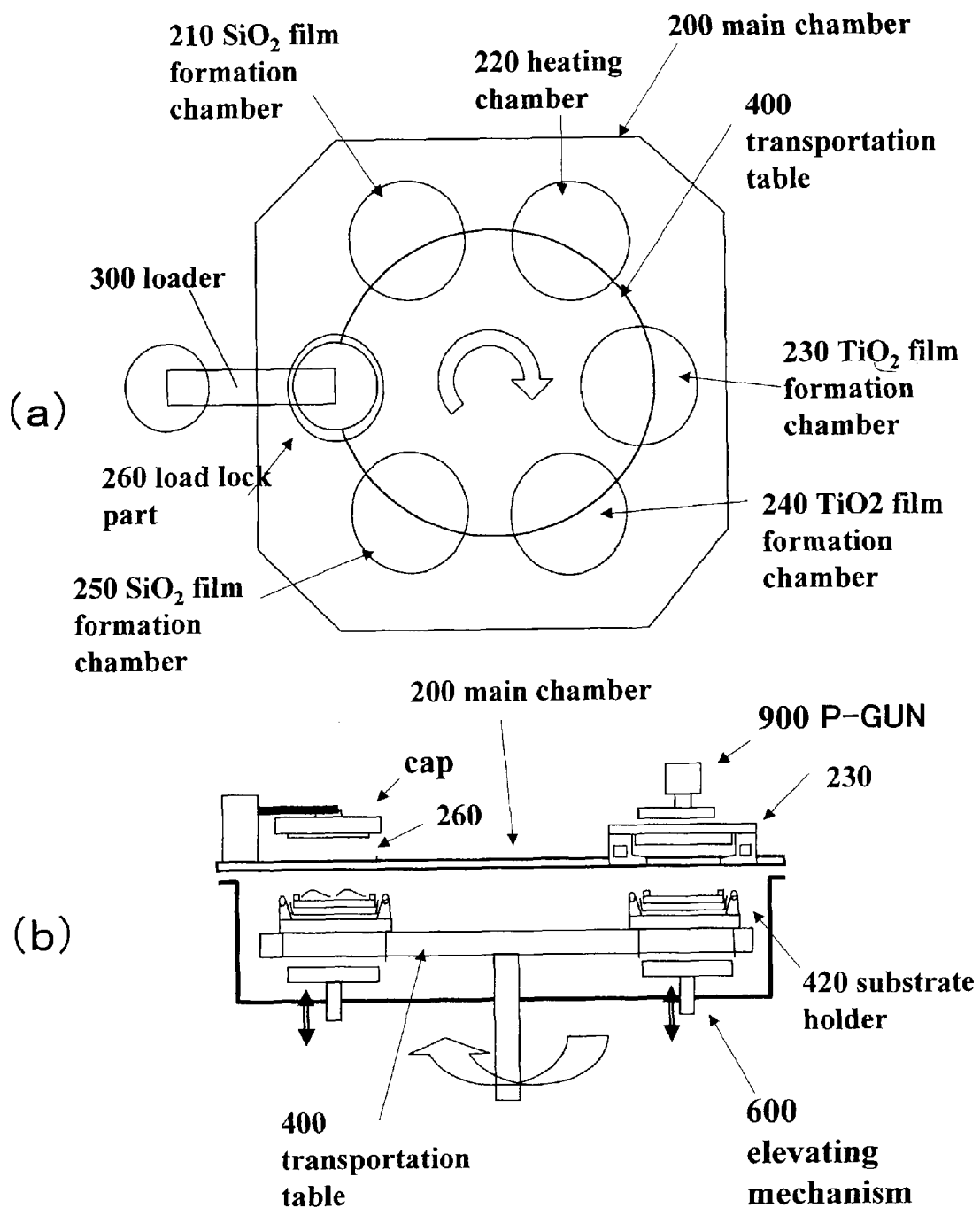
FIG. 36 is a schematic view exemplifying the main part configuration of a photocatalyst production apparatus of the invention.

FIG. 36 is a schematic view exemplifying the main part configuration of a photocatalyst production apparatus of the invention. FIG. 36(a) shows the plane structure and the FIG. 36(b) shows the cross-sectional structure.

Practically, the production apparatus of the invention has a structure comprising a SiO$_2$ film formation chamber 210, a heating chamber 220, a TiO$_2$ film formation chamber 230, a TiO$_2$ film formation chamber 240, a SiO$_2$ film formation chamber 250, and a load lock part 260 arranged in this order above a main chamber 200 which can be vacuum-evacuated.

A transportation table 400 is installed in the main chamber 200 and a substrate 100 is made rotatable and transportable to the positions under the respective chambers while being set on the transportation table 400. As shown in FIG. 36(a), when the substrate 100 is transported under the respective chambers by the transportation table 400, it is properly lifted up by an elevating mechanism 600. For example, as shown in FIG. 36(b), when the substrate 100 is transported under the TiO$_2$ film formation chamber 230, it is lifted up together with a substrate holder 420 by the elevating mechanism 600 and transferred to the inner space of the film formation chamber 230.

In the case of the production apparatus of the concrete example, the substrate 100 introduced into the chamber from the load lock part 260 is successively transported by the transportation table 400; a buffer layer 50 is formed in the SiO$_2$ film formation chamber 210; the resulting substrate is heated to a predetermined temperature in the heating chamber 220; a TiO$_2$ film (photocatalytic film) 10 with a predetermined thickness is formed in the TiO$_2$ film formation chambers 230 and 240; further a SiO$_2$ film 20 is formed in the SiO$_2$ film formation chamber 250; and then the obtained substrate is taken out of the load lock part 260.

In the heating chamber 220, the substrate 100 can be heated to a predetermined temperature by lamp heating using, for example, a quartz lamp.

Figure 37:
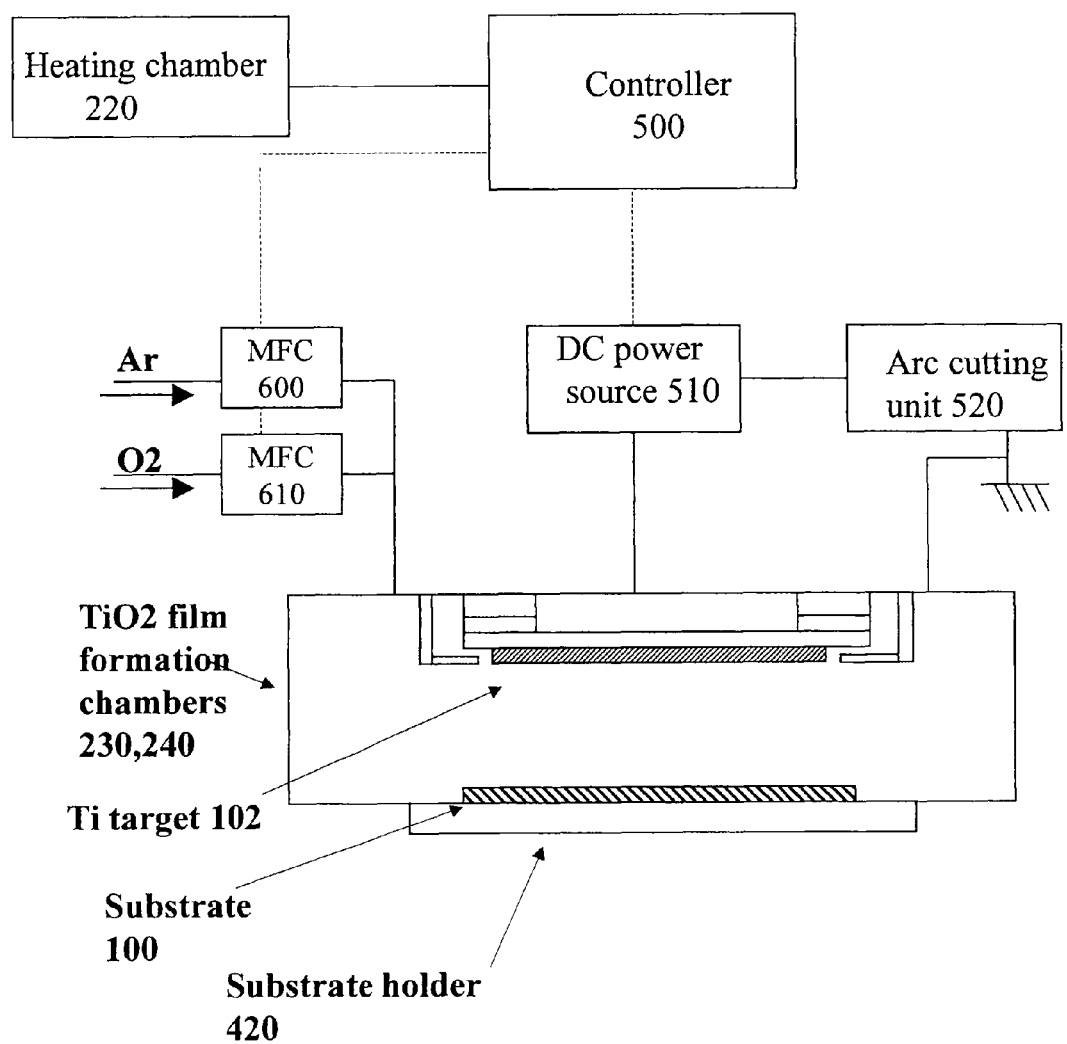
FIG. 37 is a schematic view exemplifying the main part configuration of a TiO$_2$ film formation chamber 230 (or 240).

FIG. 37 is a schematic view exemplifying the main part configuration of the TiO$_2$ film formation chamber 230 (or 240). In the film formation chamber, a titanium (Ti) target 102 is installed and reaction gases such as argon and oxygen are made to be introduced through mass flow controllers (MFC) 600 and 610.

The substrate holder 420 does not completely seal the film formation chamber 230 and an aperture (not illustrated) is properly formed therebetween. That is, the film formation chamber 230 is vacuum-evacuated by a vacuum evacuation system connected to the main chamber 200 through the aperture.

As a reaction gas containing oxygen, for example, argon and oxygen are respectively introduced into the film formation chamber 230 through the MFCs 600 and 610 and voltage is applied from a DC power source 510 to the target to carry out reactive DC sputtering.

In this example, the operation of the heating mechanism such as the lamp installed in the heating chamber 220 is made controllable by a controller 500. Specifically, as described with reference to FIGS. 15 and 16, the control is carried out so as to satisfy the relation of the film formation rate R and the substrate temperature T as the following inequality:

$$R \leq 2.36 \exp(-410(1/T)) \tag{1}.$$

For example, at the time of producing a photocatalyst, a predetermined film formation rate is inputted in the controller 500. The controller 500 then computes the temperature range so as to satisfy the above-mentioned inequality (1) and previously determines the heating conditions in the heating chamber to carry out preliminary heating so as to keep the temperature range at the time of film formation.

Also as described with reference to FIGS. 15 and 16, in order to produce an excellent photocatalyst, it is desirable to control the total pressure in a range from 3 Pa to 5 Pa and the oxygen partial pressure not lower than 10% and not higher than 30%. Accordingly, the controller 500 may be made capable of controlling the MFCs 600 and 610 so as to simultaneously satisfy the above-mentioned conditions.

The film formation rate is mainly determined by the loaded power from the DC power source 510, and besides, it is affected by the total pressure and the oxygen partial pressure, the controller 500 may be made capable of controlling the MFCs 600 and 610 in consideration of such effects.

Since the fluctuation of the substrate temperature during the film formation differs depending on the loaded power from the DC power source 510, the controller 500 is capable of controlling the heating mechanism installed in the heating chamber 220 in consideration of this point.

Further, the controller 500 may control the DC power source 510. That is, the controller 500 may control the electric power to be loaded into the target from the DC power source 510 so as to obtain a predetermined film formation rate.

Furthermore, the film formation temperature may be determined prior but not the film formation rate be determined and inputted prior. That is, a film formation temperature is previously appointed and the controller 500 may compute the film formation rate so as to satisfy the above-mentioned inequality (1) at the film formation temperature and controls the DC power source 510.

Alternatively, neither the film formation rate nor the film formation temperature is previously set and the controller may properly determine them to carry out film formation. Also in this case, the controller 500 determines the film formation rate and the film formation temperature so as to satisfy the above-mentioned inequality (1) and carries out film formation.

As described above, according to this example, a photocatalyst having excellent photocatalytic properties can stably be produced with a high reproductivity by properly determining and controlling the relation between the film formation rate and the film formation temperature.

Figure 38:
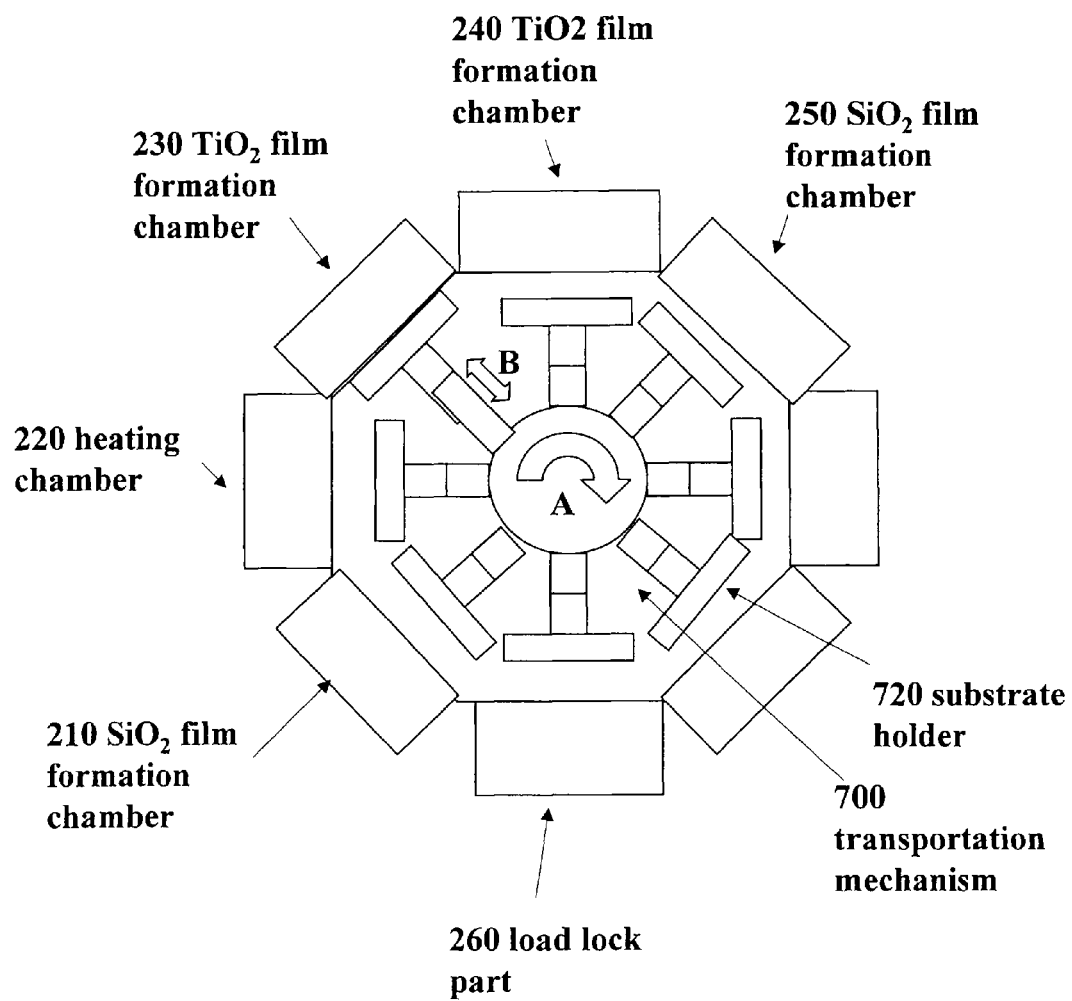
FIG. 38 is a schematic view showing a modified example of the photocatalyst production apparatus of the invention.

FIG. 38 is a schematic view showing a modified example of a photocatalyst production apparatus of the invention. The figure shows a plane structure of the production apparatus and the apparatus has a structure comprising a vertical $SiO_2$ film formation chamber 210, a heating chamber 220, a $TiO_2$ film formation chamber 230, a $TiO_2$ film formation chamber 240, a $SiO_2$ film formation chamber 250, and a load lock part 260 arranged in this order around a transportation mechanism 700.

The transportation mechanism 700 has radial holders 720 capable of setting a substrate, rotating in the direction shown as the arrow A and transporting the substrate in the direction show as the arrow B.

Figure 39:
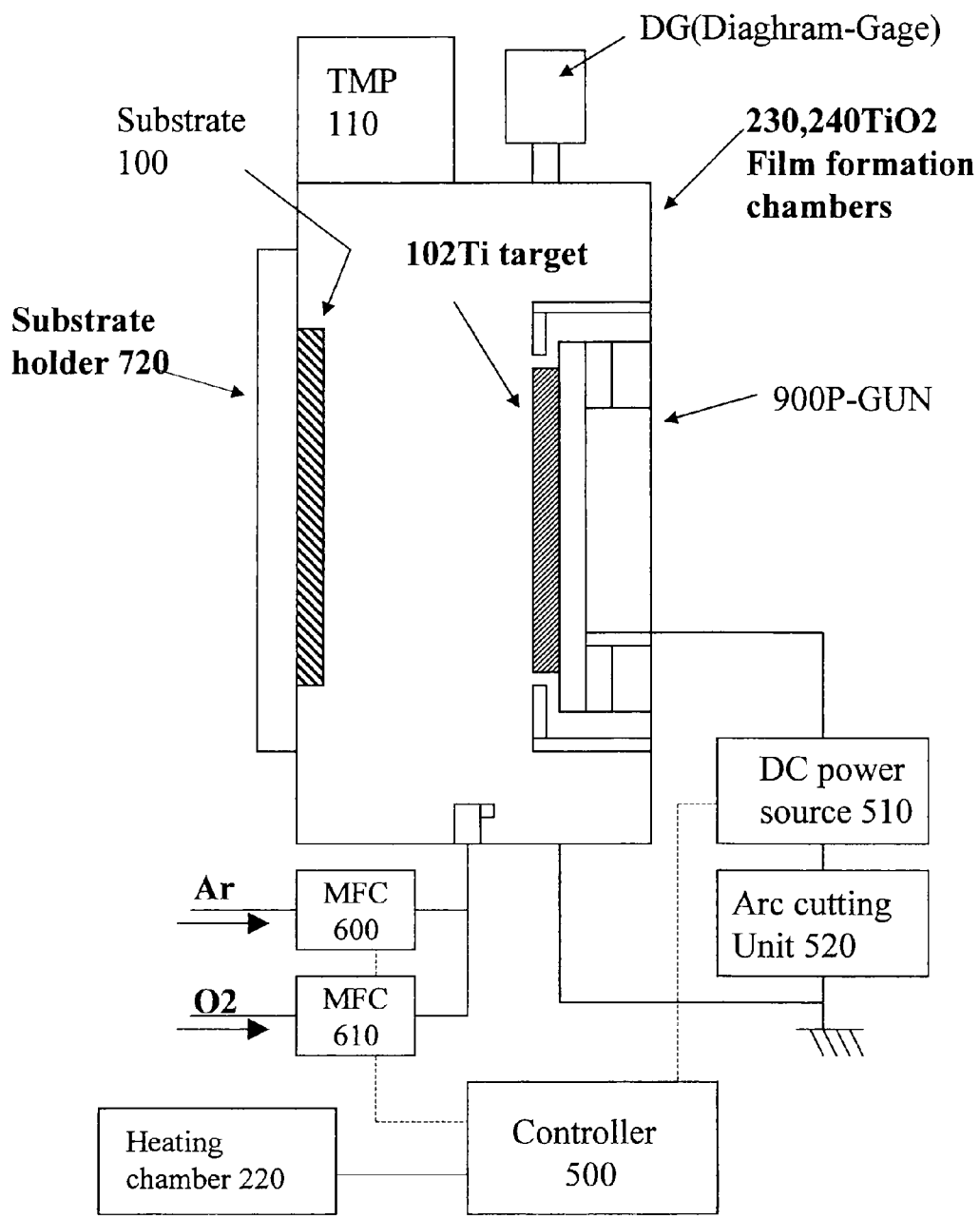
FIG. 39 is a cross-sectional view of TiO$_2$ film formation chamber 230 or 240 in the vertical direction.

FIG. 39 is a cross-sectional view of the $TiO_2$ film formation chamber 230 or 240 in the vertical direction. Same symbols are assigned to the same components described above with reference to FIG. 37 and therefore detailed description will be omitted with respect to this figure.

The substrate 100 set on the substrate holder 720 is rotated and transported to the front of a chamber by the transportation mechanism 700 and further transported toward the chamber and air-tightly enclosed in the chamber by the holder 720. In such a state, the film formation chamber 230 (240) is vacuum-evacuated by a turbo molecular pump (TMP) 110. The transportation space by the transportation mechanism 700 is also kept in a vacuum state by a vacuum evacuation system which is not illustrated.

In the film formation chamber 230 (240), argon and oxygen are introduced to carry out reactive sputtering. At that time, in the same manner as described relevant to FIG. 37, the film formation rate and the film formation temperature are controlled by the controller 500 so as to satisfy the above-mentioned inequality (1). For example, in the case where the film formation rate is previously appointed, the controller computes the heating conditions of the substrate so as to satisfy the above-mentioned inequality (1) in the film formation rate and controls the operation of the heating mechanism installed in the heating chamber 220 to heat the substrate. In the case of this modified example, the controller 500 may be capable of controlling not only the heating mechanism but also the DC power source 510. In this case, the controller 500 controls the DC power source 510 to carry out film formation of the $TiO_2$ film.

As described above with reference to FIGS. 15 and 16, in order to produce an excellent photocatalyst, it is preferable to control the total pressure in a range from 3 Pa to 5 Pa and the oxygen partial pressure not lower than 10% and not higher than 30%. Accordingly, the controller 500 may carry out control so as to simultaneously satisfy the above-mentioned conditions.

Also the production apparatus of this modified example can stably produce a photocatalyst having excellent photocatalytic properties with a high reproductivity by properly determining and controlling the relation between the substrate heating condition and the film formation rate by the controller 500.

Incidentally, in FIGS. 36 to 39, concrete examples of previously heating the substrate 100 in the heating chamber 220 installed separately from the film formation chamber are described.

However, the invention is not limited to these examples. For example, same effects can be achieved by similarly applying the invention in a production apparatus comprising substrate heating mechanisms installed in the film formation chambers 230 and 240. In the case of such a production apparatus, the controller 500 may control the substrate heating mechanisms so as to satisfy the above-mentioned inequality (1) and carry out the film formation.

While the invention has been described with reference to the concrete examples, the description is illustrative of the invention and is not to be construed as limiting the invention.

For example, as the photocatalytic film of the invention, it is not limited to titanium oxide ($TiO_2$), and similar effects can be obtained by using those obtained by adding predetermined elements to titanium oxide and they are included the scope of the invention.

In the case of forming the photocatalytic film of the invention by sputtering, the reaction gas to be introduced into the chamber is not limited to argon and oxygen, and for example, it may be a gas mixture of oxygen and gas other than argon and a gas mixture of argon, oxygen and another gas.

INDUSTRIAL APPLICABILITY

As described above in details, according to the invention, a photocatalyst excellent in the photocatalytic function can be provided by forming a particularly porous photocatalytic film differently from a conventional one.

The photocatalyst can maintain the hydrophilicity at a high level even in a dark place without deteriorating the photocatalytic function by depositing a silicon oxide film with a predetermined thickness.

Moreover, according to the invention, since the photocatalytic film is formed at a remarkably higher deposition rate than that of a conventional one, the production throughput is greatly improved and the productivity is improved to considerably lower the cost.

Further, an object coated with the photocatalyst of the invention may be any if its surface is coated with the photocatalyst of the invention and it may include various materials such as a rearview mirror, a body, and window glass for an automobile; a variety of mirrors for a bath room and the like; an outer wall material for a building; an inner wall material for a bath room; a toilet stool; a sink; a signpost, and external materials of various displays.

In the case of application to a rearview mirror for an automobile, a clear visible field and safety can be obtained owing to the dropping function of droplets and fogging-preventing function of the photocatalytic film. Also, in the case of application to an automotive body, a signpost, and an outer wall material of a building, self-cleaning function by rainfall can be obtained.

Consequently, the invention provides a highly capable photocatalyst at a low cost and supplies a variety of coated bodies by its application in markets and thus greatly contributes in industrial fields.

The invention claimed is:

1. A method for producing a photocatalyst comprising a photocatalytic film of a compound of titanium and oxygen, wherein the method includes
    a step of depositing a porous photocatalytic film at a film formation rate not lower than 0.2 nm/s and not higher than 0.6 nm/s by sputtering a titanium-containing target in oxygen-containing atmosphere at not lower than 3 Pa and not higher than 5 Pa containing oxygen not less than 10% and not more than 30%, and the deposition is carried out at a temperature satisfying the following inequality:

$R \leq 2.36 \exp(-410(1/T))$ where R denotes a deposition rate and T (degrees C) denotes a temperature of a surface to deposit the photocatalytic film thereon.

2. The method for producing a photocatalyst according to claim 1, wherein the sputtering is carried out by a DC sputtering.

3. The method for producing a photocatalyst according to claim 1, wherein a film thickness of the photocatalyst film is not thinner than 40 nm and not thicker than 100 nm.

4. The method for producing a photocatalyst according to claim 1, wherein a film thickness of the photocatalyst film is not thinner than 40 nm and not thicker than 80 nm.

5. The method for producing a photocatalyst according to claim 1, wherein a buffer layer of silicon oxide is deposited prior to the deposition of the photocatalytic film.

6. The method for producing a photocatalyst according to claim 1, wherein the method further includes a step of depositing silicon oxide on the photocatalytic film.

7. A method for producing a photocatalyst comprising:

a step of depositing a photocatalytic film at a film formation rate of 0.6 nm/s or lower by sputtering a titanium-containing target in oxygen-containing atmosphere;

wherein the photocatalytic film is an agglomerate of a number of grains, is formed to be porous including gaps among the number of grains at a surface of the photocatalytic film, and has 0.02 to higher value as a value calculated by dividing the arithmetical mean deviation of profile Ra with a film thickness, and the film thickness of the photocatalytic film is not thinner than 40 nm and not thicker than 100 nm, wherein the photocatalytic film is made of titanium oxide formed by the sputtering, and wherein the titanium oxide has 100 or less value as the intensity ratio of a (101) diffraction peak of the anatase structure of titanium oxide to a (215) diffraction peak of the anatase structure of titanium oxide measured using a Kα1 characteristic X-ray of copper.

8. The method for producing a photocatalyst according to claim 7, wherein a deposition of the photocatalytic film is carried out at a temperature satisfying the following inequality:

$R \leq 2.36 \exp(-410(1/T))$ where R denotes a deposition rate and T denotes a temperature of the surface to deposit the photocatalytic film thereon.

9. The method for producing a photocatalyst according to claim 7, wherein a buffer layer of silicon oxide is deposited prior to a deposition of the photocatalytic film.

10. The method for producing a photocatalyst according to claim 7, wherein the method further includes a step of depositing silicon oxide on the photocatalytic film.

11. A method for producing a photocatalyst comprising a step of depositing a photocatalytic film by sputtering a titanium-containing target in oxygen-containing atmosphere at not lower than 3 Pa and not higher than 5 Pa;

wherein the photocatalytic film is an agglomerate of a number of grains, is formed to be porous including gaps among the number of grains at a surface of the photocatalytic film, and has 0.02 to higher value as a value calculated by dividing the arithmetical mean deviation of profile Ra with a film thickness, and the film thickness of the photocatalytic film is not thinner than 40 nm and not thicker than 100 nm, wherein the photocatalytic film is made of titanium oxide formed by the sputtering, and wherein the titanium oxide has 100 or less value as the intensity ratio of a (101) diffraction peak of the anatase structure of titanium oxide to a (215) diffraction peak of the anatase structure of titanium oxide measured using a Kα1 characteristic X-ray of copper.

12. A method for producing a photocatalyst comprising a step of depositing a photocatalytic film by sputtering a titanium-containing target in atmosphere containing oxygen not less than 10% and not more than 30%;

wherein the photocatalytic film is an agglomerate of a number of grains, is formed to be porous including gaps among the number of grains at a surface of the photocatalytic film, and has 0.02 to higher value as a value calculated by dividing the arithmetical mean deviation of profile Ra with a film thickness, and the film thickness of the photocatalytic film is not thinner than 40 nm and not thicker than 100 nm, wherein the photocatalytic film is made of titanium oxide formed by the sputtering, and wherein the titanium oxide has 100 or less value as the intensity ratio of a (101) diffraction peak of the anatase structure of titanium oxide to a (215) diffraction peak of the anatase structure of titanium oxide measured using a Kα1 characteristic X-ray of copper.

* * * * *